(12) United States Patent
Yang et al.

(10) Patent No.: US 12,242,773 B2
(45) Date of Patent: Mar. 4, 2025

(54) ARTIFICIAL INTELLIGENCE SYSTEMS AND METHODS FOR INTERIOR DESIGN

(71) Applicant: REALSEE (BEIJING) TECHNOLOGY CO., LTD, Beijing (CN)

(72) Inventors: Bin Yang, Beijing (CN); Yilang Hu, Beijing (CN); Yi Zhu, Beijing (CN); Chengcong Xin, Beijing (CN); Chong Su, Beijing (CN); Shili Deng, Beijing (CN)

(73) Assignee: REALSEE (BEIJING) TECHNOLOGY CO., LTD., Beijing (CN)

( * ) Notice: Subject to any disclaimer, the term of this patent is extended or adjusted under 35 U.S.C. 154(b) by 679 days.

(21) Appl. No.: 17/180,377

(22) Filed: Feb. 19, 2021

(65) Prior Publication Data

US 2021/0173967 A1 Jun. 10, 2021

Related U.S. Application Data

(63) Continuation of application No. 16/929,082, filed on Jul. 14, 2020, now Pat. No. 10,956,626.

(30) Foreign Application Priority Data

Jul. 15, 2019 (CN) .......................... 201910636694.0
Jul. 15, 2019 (CN) .......................... 201910637579.5
(Continued)

(51) Int. Cl.
*G06F 30/12* (2020.01)
*G06N 3/08* (2023.01)
(Continued)

(52) U.S. Cl.
CPC ............... *G06F 30/12* (2020.01); *G06N 3/08* (2013.01); *G06N 7/01* (2023.01); *G06T 19/20* (2013.01)

(58) Field of Classification Search
CPC .. G06F 30/12; G06N 7/01; G06N 3/08; G06T 19/20
See application file for complete search history.

(56) References Cited

U.S. PATENT DOCUMENTS 9,836,749 B1 * 12/2017 Bowman .............. G06Q 30/018
2018/0350216 A1 * 12/2018 Satkin .............. G08B 13/19639

OTHER PUBLICATIONS

A. Colburn, A. Agarwala, A. Hertzmann, B. Curless, M. F. Cohen, "Image-Based Remodeling" IEEE 2013, pp. 56-66. (Year: 2013).*
(Continued)

*Primary Examiner* — Kibrom K Gebresilassie
(74) *Attorney, Agent, or Firm* — BAYES PLLC

(57) ABSTRACT

Systems and methods for generating a remodeling plan for a property are disclosed. An exemplary system includes a communication interface configured to receive a floor plan of the property and a remodeling preference. The system further includes at least one processor configured to obtain structural data of the property based on the floor plan and obtain a neural network model based on the remodeling preference. The neural network model is trained using sample floor plans and sample remodeling data for the remodeling preference. The at least one processor is further configured to learn structural remodeling information based on the floor plan and the structural data using the neural network model. The at least one processor is also configured to generate the remodeling plan for the property based on the structural remodeling information. The remodeling plan identifies one or more structures in the floor plan for remodeling.

20 Claims, 13 Drawing Sheets

(30) Foreign Application Priority Data

Jul. 15, 2019 (CN) .......................... 201910637657.1
Jul. 15, 2019 (CN) .......................... 201910637659.0

(51) Int. Cl.
*G06N 7/01* (2023.01)
*G06T 19/20* (2011.01)

(56) References Cited

OTHER PUBLICATIONS

A. Colburn, A. Agarwala, A. Hertzmann, B. Curless, M. F. Cohen, "Image-Based Remodeling" IEEE 2013, pp. 56-66.*
Colburn, A. Agarwala, A. Hertzmann, B. Curless, M. F. Cohen, "Image-Based Remodeling" IEEE 2013, pp. 56-66, (Year: 2013).*

* cited by examiner

ARTIFICIAL INTELLIGENCE SYSTEMS AND METHODS FOR INTERIOR DESIGN

RELATED APPLICATIONS

This is a continuation of U.S. application Ser. No. 16/929,082, filed Jul. 14, 2020, which claims the benefits of priority to Chinese Application No. 201910636694.0 filed on Jul. 15, 2019, Chinese Application No. 201910637657.1 filed on Jul. 15, 2019, Chinese Application No. 201910637579.5 filed on Jul. 15, 2019, and Chinese Application No. 201910637659.0 filed on Jul. 15, 2019, all of which are hereby incorporated by reference in their entireties.

TECHNICAL FIELD

The present disclosure relates to systems and methods for interior design, and more particularly, to artificial intelligence systems and methods for generating interior design plans (e.g., remodeling and/or furnishing plans) and visualization of such interior design.

BACKGROUND

Property owners may need assistance with interior design at various occasions, such as, when they would like to remodel a space, refurnish a space, or stage a space before putting the property on the market. One challenge with interior design has been imposed by the difficulty to access how the design plan may adapt to the actual space before the plan is executed. For example, when a person is browsing online to search for a piece of furniture for his living room, while the furniture may be well depicted with multiple images or videos, the user could not visualize how it may fit into his living room. It is usually not clear to the property owner until the piece of furniture is purchased and placed into the living room that the dimensions of the piece may not fit or the style of the piece does not match with other decorations in the room.

In addition to furnishing, interior remodeling also requires the remodeling plan to adapt to the actual floor plan. For example, the remodeling design should take into consideration such as the size of the space, the layout, intended function of the space, and furnishing preferences, etc. Sometimes, during a kitchen remodeling project, it is hard for the property owner to decide whether to knock off a wall to reduce it to a half wall, let alone how to make it happen.

Therefore, interior designing can greatly benefit from intelligently generated design plans (e.g., remodeling plans or furnishing plans) and the ability to visualize the design in the actual space before the design will be implemented in that space. To address these needs, embodiments of the disclosure provide artificial intelligence systems and methods for generating interior design plans (e.g., remodeling and/or furnishing plans) and visualization of such interior design.

SUMMARY

In one aspect, embodiments of artificial intelligence systems, methods, computer-readable medium for visualizing furnishing objects in an image of an interior space are disclosed. In some embodiments, the image of the interior space may be captured by a 3D scanner and include existing furnishing objects. The existing furnishing objects may be removed and the image may be restored by filling the holes left after removing the furnishing objects. One or more new furnishing objects may be inserted to the restored image and the placement of the furnishing objects in the image may be adjusted, before the new image is provided to a user.

In another aspect, embodiments of artificial intelligence systems, methods, computer-readable medium for suggesting new furnishing objects for an interior space are disclosed. In some embodiments, the image of the interior space may be captured by a 3D scanner and include existing furnishing objects. Feature information of the existing furnishing objects in the image may be determined using a learning model. Dimension information of the existing furnishing objects may be determined based on 3D point cloud data. Target furnishing objects that do not match with the interior space may be identified based on attributes of the furnishing objects determined based on the feature information and/or the dimension information. New furnishing objects may be selected and suggested to a user to replace the nonmatched furnishing objects.

In yet another aspect, embodiments of artificial intelligence systems, methods, computer-readable medium for generating a remodeling plan for a property are disclosed. In some embodiments, structural data may be obtained based on a floor plan of the property. A simplified floor plan may be determined based on the structural data. Structural remodeling information may be learned using a learning network applied to the floor plan, simplified floor plan, and structural data. The remodeling plan may be generated by processing the structural remodeling information.

In yet another aspect, embodiments of artificial intelligence systems, methods, computer-readable medium for generating a furnishing plan for a property are disclosed. In some embodiments, structural data may be obtained based on a floor plan of the property. Furnishing information may be learned by applying the neural network model to the floor plan and the structural data. The furnishing information identify one or more furnishing objects, positions of the respective furnishing objects placed in the floor plan, and dimensions of the respective furnishing objects. The furnishing plan may be generated for the property based on the furnishing information.

It is to be understood that both the foregoing general description and the following detailed description are exemplary and explanatory only and are not restrictive of the invention, as claimed.

DETAILED DESCRIPTION

Reference will now be made in detail to the exemplary embodiments, examples of which are illustrated in the accompanying drawings. Wherever possible, the same reference numbers will be used throughout the drawings to refer to the same or like parts.

Figure 1:
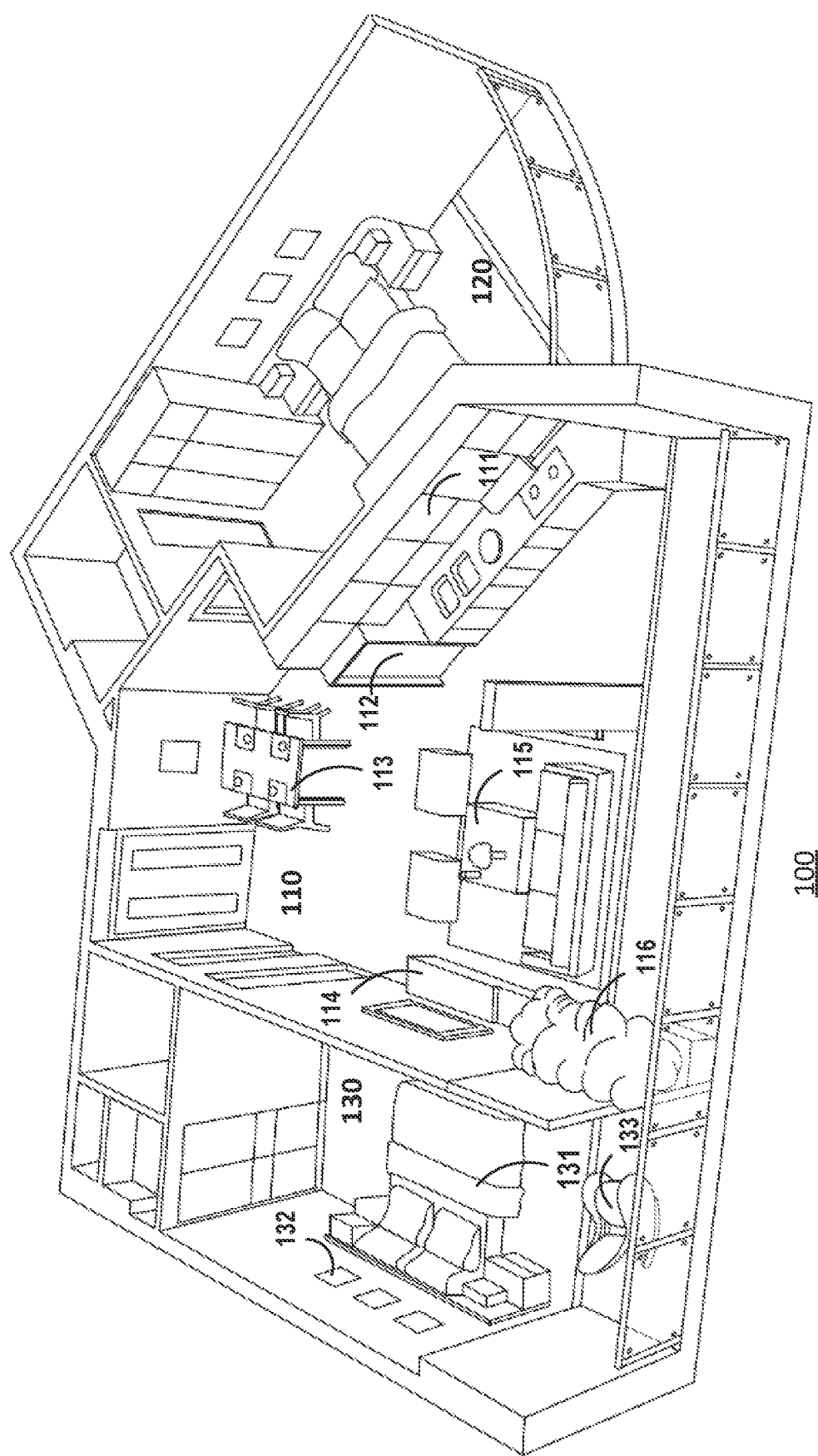
FIG. 1 illustrates a schematic diagram of an exemplary three-dimensional view of a real state property, according to embodiments of the disclosure.

FIG. 1 illustrates a schematic diagram of an exemplary three-dimensional (3D) view of a real estate property 100 (hereafter "property 100"), according to embodiments of the disclosure. In some embodiments, property 100 may be a residential property such as a house, an apartment, a townhouse, a garage, or a commercial property such as a warehouse, an office building, a hotel, a museum, and a store, etc. As shown in FIG. 1, the three-dimensional view virtually recreates property 100 including its layout (e.g., the framing structures that divide the property into several rooms such as walls and counters), finishing (e.g., kitchen/bathroom cabinets, bathtub, island, etc.), fixtures installed (e.g., appliances, window treatments, chandeliers, etc.), and furniture and decorations (e.g., beds, desks, tables and chairs, sofas, TV stands, bookshelves, wall paintings, mirrors, plants, etc.)

In some embodiments, property 100 may include multiple rooms or functional spaces separated by interior walls. For example, property 100 may include a living room, bedroom, dining room, kitchen, bathroom, etc. As shown in FIG. 1, property 100 may include a great room 110 that has combined functions of a living room and a kitchen and bedrooms 120 and 130.

The three-dimensional view of property 100 may be rendered from multiple point clouds acquired of the property. The multiple point clouds may be acquired at different view angles. The point clouds are then post-processed and merged to render the 3D view. Consistent with the present disclosure, a point cloud is a set of data points in space, which measures the external surface of an object. Point cloud is typically represented by a set of vectors in a three-dimensional coordinate system. In some embodiments, the point cloud may include the three-dimensional coordinates of each data point therein. Point clouds are generally acquired by 3D scanners, which survey the external surface surrounding the object.

Consistent with embodiments of present disclosure, interior design of property 100 may include the remodeling of its structure. For example, as shown in FIG. 1, remodeling great room 110 may include changing the framing structures that separate great room 110 from bedroom 130, or changing the layout of the kitchen area. Remodeling of great room 110 may further include removing or adding windows or doors to the walls. For instances, property owners may typically remodel their properties before putting them on market for sale or rent or after purchasing it from previous owners.

Consistent with embodiments of present disclosure, interior design of property 100 may additionally include furnishing and decorating the interior space of the property. For example, as shown in FIG. 1, great room 110 may be furnished with dining set 113, a TV stand 114, and a living room set 115. Great room 110 may be further decorated with, e.g., plants 116. Similarly, bedroom 130 may be furnished with a bed 131 and a rocking chair 133, and decorated with pictures 132. Sometimes, property owners may want to refurnish/redecorate the respective spaces, to accommodate different use or style. For example, bedroom 130 may be converted to a nursery in expectation of a newborn, so that bed 131 may be replaced with a crib and a changing table, and the room may be decorated with a cartoon theme. As another example, the property owner may have a change of taste and would like to replace European style furniture with modern furniture. Sometimes, properties may be staged with staging furniture and decorative pieces before conducting open houses.

Remodeling or furnishing/refurnishing a property, or a part of the property, is a time consuming and high cost project. Property owners do not want to wait until it is completed to find that it is not quite the effect they have imagined and desired. It would be a hassle to make any adjustment afterwards. For example, when a piece of furniture is purchased and delivered, it is difficult to return or change it. It is even more difficult to undo any structural changes made to the property. The present disclosure provides systems and methods artificial intelligence systems and methods for generating an interior design plan for a space (e.g., property 100) and providing a visualization of the same, so that the user (e.g., a property owner or an interior designer) could have a close-to-reality feel of the design effect in the space. In some embodiments, the disclosed systems and methods may use neural networks to intelligently generate the design plans based on the attributes of the actual space and generate the visual representations based on the design plans.

Figure 2:
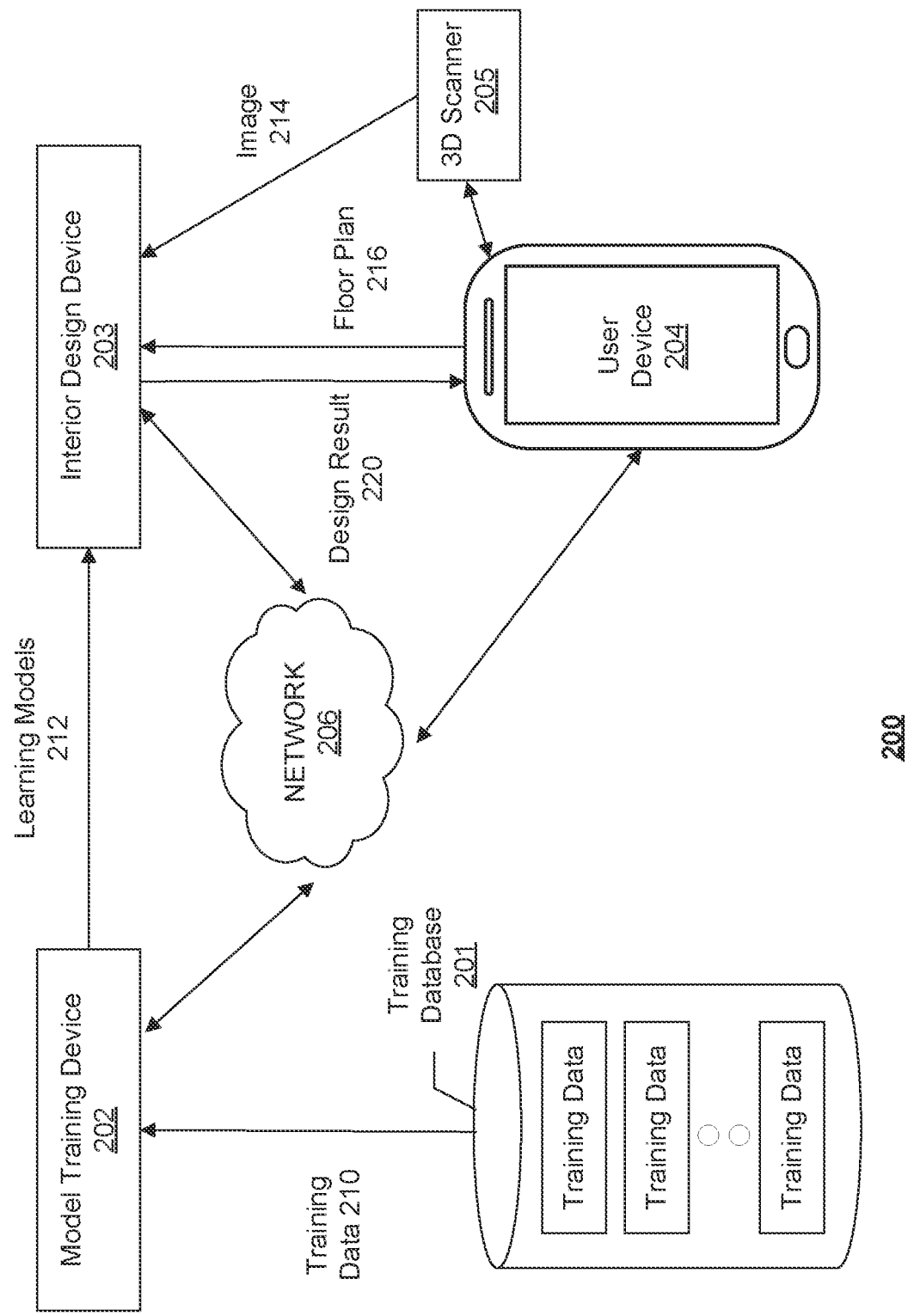
FIG. 2 illustrates an exemplary artificial intelligence system for interior design, according to embodiments of the disclosure.

FIG. 2 illustrates an exemplary artificial intelligence interior design system 200 (referred to as "system 200" hereafter), according to some embodiments of the disclosure. In some embodiments, system 200 may be configured to provide interior design suggestions and/or visual representations for an actual space. For example, system 200 may provide furnishing/decoration suggestions based on an image depicting an interior space provided by the user. As another example, system 200 may provide remodeling or furnishing suggestions based on a floor plan provided by the user.

In some embodiments, system 200 may make the design suggestions using a machine learning network. As shown in FIG. 2, system 200 may include components for performing two phases, a training phase and a learning phase. To perform the training phase, system 200 may include a training database 201 for storing training data 210 and a model training device 202 for training learning models 212. In some embodiments, learning models 212 may include learning models for making design suggestions and learning models for generating visual representations. To perform the learning phase, system 200 may include interior design device 203 for intelligently generate design plans/suggestions and visual representations using trained learning models 212. In some embodiments, system 200 may include more or less of the components shown in FIG. 2. For example, when learning models 212 are pre-trained and provided, system 200 may include only device 203.

In some embodiments, system 200 may optionally include a network 206 to facilitate the communication among the various components of system 200, such as databases 201, and devices 202, 203, user device 204, and 3D scanner 205. For example, network 206 may be a local area network (LAN), a wireless network, a cloud computing environment (e.g., software as a service, platform as a service, infrastructure as a service), a client-server, a wide area network (WAN), etc. In some embodiments, network 206 may be replaced by wired data communication systems or devices.

In some embodiments, the various components of system 200 may be remote from each other or in different locations, and be connected through network 206 as shown in FIG. 2. In some alternative embodiments, certain components of system 200 may be located on the same site or inside one device. For example, training database 201 may be located on-site with or be part of model training device 202. As another example, model training device 202 and interior design device 203 may be inside the same computer or processing device.

As shown in FIG. 2, model training device 202 may communicate with training database 201 to receive one or more sets of training data 210. Model training device 202 may use the training data received from training database 201 to train a plurality of learning models (e.g., trained learning models 212). Trained learning models 212 may include learning models for learning furnishing information and generating furnishing plans, and learning model for learning remodeling information and generating remodeling plans, and the like. Learning models 212 may be trained using training data 210 stored in training database 201.

In some embodiments, the training phase may be performed "online" or "offline." An "online" training refers to performing the training phase contemporarily with the learning phase. An "online" training may have the benefit to obtain a most updated learning models based on the training data that is then available. However, an "online" training may be computational costive to perform and may not always be possible if the training data is large and/or the models are complicate. Consistent with the present disclosure, an "offline" training is used where the training phase is performed separately from the learning phase. Learned models 212 may be trained offline and saved and reused for assisting interior design.

Model training device 202 may be implemented with hardware specially programmed by software that performs the training process. For example, model training device 202 may include a processor and a non-transitory computer-readable medium. The processor may conduct the training by performing instructions of a training process stored in the computer-readable medium. Model training device 202 may additionally include input and output interfaces to communicate with training database 201, network 206, and/or a user interface (not shown). The user interface may be used for selecting sets of training data, adjusting one or more parameters of the training process, selecting or modifying a framework of the learning model, and/or manually or semi-automatically providing ground-truth associated with training data 210.

Trained learning models 212 may be used by interior design device 203 to make design suggestions to new interior spaces or floor plans. Interior design device 203 may receive trained learning models 212 from model training device 202. Interior design device 203 may include a processor and a non-transitory computer-readable medium (discussed in detail in connection with FIG. 3). The processor may perform instructions of a sequence of interior design processes stored in the medium. Interior design device 203 may additionally include input and output interfaces to communicate with user device 204, 3D scanner 205, network 206, and/or a user interface (not shown). The user interface may be used for receiving an image 214 or a floor plan 216 for interior design suggestions or visualization. The user interface may further provide the design plans/suggestions along with the visual representations to user device 204 for display.

In some embodiments, user device 204 may be a cellular device or a smart phone, a personal digital assistant (PDA), a laptop computer, a tablet device and a wearable device, which may provide network connection and process resources to communicate with interior design device 203 through network 206. User device 204 may also include, for example, an on-board computing system or customized hardware. User device 204 may also run designated service applications such as interior design applications to provide design assistance and suggestions to the user.

User device 204 may include an interface for user interaction. For example, the interface may be a touchscreen or a keyboard (physical keyboard or soft keyboard) for the user to input data to user device 204. In some embodiments of the present disclosure, user may send image 214 captured by 3D scanner 205 or floor plan 216 to interior design device 203, via user device 204. In some embodiments of the present disclosure, interior design device 203 may provide design suggestions and visual representations to user device 204. User device 204 may display the suggestions and representations to the user through the interface. For example, user device 204 may display a rendered view of the user provided interior space with suggested furniture and decorations inserted in.

System 200 may further include a 3D scanner 205 to capture depth images of an interior space (e.g., a room in property 100). Consistent with the present disclosure, 3D scanner 205 may be selected from RGB-D devices, 2D/3D LiDARs, stereo cameras, time-of-flight (ToF) cameras, etc. Each of these 3D scanners may acquire depth information as well as color information. In some embodiments, 3D scanner 205 may be integrated with user device 204, e.g., embedded on the back of user device 204. In some embodiments, 3D scanner 205 ray be external to user device 204 but connected to user device 204 via network 206 to transmit the captured images to user device 204. In some embodiments, the captured depth image (e.g., image 214) may be sent to and stored on user device 204 first and the user gets to decide whether and when to send it to interior design device 203. In some other embodiments, 3D scanner 205 may send image 214 directly to interior design device 203.

In some embodiments, 3D scanner 205 may acquire depth images at different view angles, and point clouds can be determined based on the respective depth images acquired at the respective different view angles. A depth image is an image or image channel that includes depth information between the view point (where 3D scanner 205 is located) and the surface of the object. The depth image is similar to a grayscale image, where each pixel value represents the distance (L) between the acquisition device and the target point on the object surface. Each pixel value of the depth image occupies a "short" length in storage, which equals to two bytes or 16 bits. For example, the unit length for distance L may be 1/5000 meters (0.2 millimeters). In that case, one meter in distance can encompass 13 pixels and a 16-bit storage can store 65535 pixel values. It is contemplated that the unit can be selected to be a different length, as long it is sufficient to differentiate target points in the depth image as well as not introducing burdensome computational complexity. The goal is to achieve a balance between the visual effect and the computational cost.

Figure 3:
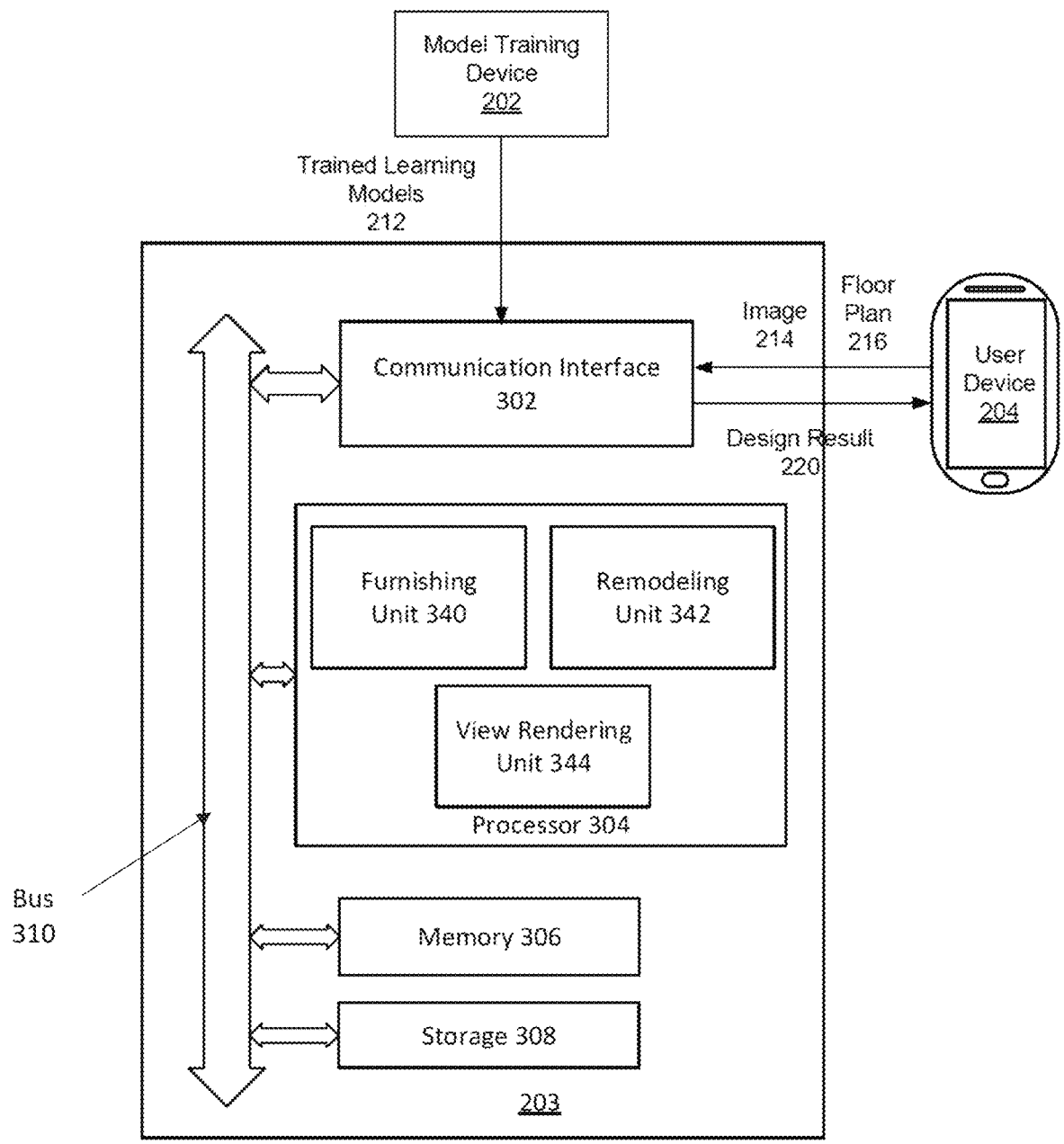
FIG. 3 is a block diagram of an exemplary interior design device, according to embodiments of the disclosure.

FIG. 3 is a block diagram of an exemplary interior design device 203, according to embodiments of the disclosure. In some embodiments, interior design device 203 may be implemented by a physical server or a service in the cloud. In some other embodiments, interior design device 203 may be implemented by a computer or a consumer electronic device such as a mobile phone, a pad, or a wearable device. As shown in FIG. 3, interior design device 203 may include a communication interface 302, a processor 304, a memory 306, a storage 308, and a bus 310. In some embodiments, interior design device 203 may have different modules in a single device, such as an integrated circuit (IC) chip (implemented as an application-specific integrated circuit (ASIC) or a field-programmable gate array (FPGA)), or separate devices with dedicated functions. Components of interior design device 203 may be in an integrated device, or distributed at different locations but communicate with each other through a network (not shown). The various components of interior design device 203 may be connected to and communicate with each other through bus 310.

Communication interface 302 may send data to and receive data from components such as user device 204 and 3D scanner 205 via direct communication links, a Wireless Local Area Network (WLAN), a Wide Area Network (WAN), wireless communication networks using radio waves, a cellular network, and/or a local wireless network (e.g., Bluetooth™ or WiFi), or other communication methods. In some embodiments, communication interface 302 can be an integrated services digital network (ISDN) card, cable modem, satellite modem, or a modem to provide a data communication connection. As another example, communication interface 302 can be a local area network (LAN) card to provide a data communication connection to a compatible LAN. Wireless links can also be implemented by communication interface 302. In such an implementation, communication interface 302 can send and receive electrical, electromagnetic or optical signals that carry digital data streams representing various types of information via a network.

Consistent with some embodiments, communication interface 302 may receive depth images (e.g., image 214) acquired by 3D scanner 205. In some embodiments, communication interface 302 may further receive floor plan 216 and other design preferences provided by the user via user device 204. In some further embodiments, communication interface 302 may also receive trained learning models 212 from model training device 202. Communication interface 302 may provide the received information or data to memory 306 and/or storage 308 for storage or to processor 304 for processing.

Processor 304 may include any appropriate type of general-purpose or special-purpose microprocessor, digital signal processor, or microcontroller. Processor 304 may be configured as a separate processor module dedicated to interior design. Alternatively, processor 304 may be configured as a shared processor module for performing other functions related to or unrelated to interior design. For example, the interior design application is just one application installed on a versatile device.

As shown in FIG. 3, processor 304 may include multiple modules, such as a furnishing unit 340, a remodeling unit 342, and a view rendering unit 344, and the like. These modules (and any corresponding sub-modules or sub-units) can be hardware units (e.g., portions of an integrated circuit) of processor 304 designed for use with other components or to execute part of a program. The program may be stored on a computer-readable medium (e.g., memory 306 and/or storage 308), and when executed by processor 304, it may perform one or more functions. Although FIG. 3 shows units 340-344 all within one processor 304, it is contemplated that these units may be distributed among multiple processors located near or remotely with each other.

Memory 306 and storage 308 may include any appropriate type of mass storage provided to store any type of information that processor 304 may need to operate. Memory 306 and storage 308 may be a volatile or non-volatile, magnetic, semiconductor, tape, optical, removable, non-removable, or other type of storage device or tangible (i.e., non-transitory) computer-readable medium including, but not limited to, a ROM, a flash memory, a dynamic RAM, and a static RAM. Memory 306 and/or storage 308 may be configured to store one or more computer programs that may be executed by processor 304 to perform image processing, interior design suggestion, and view rendering as disclosed herein. For example, memory 306 and/or storage 308 may be configured to store program(s) that may be executed by processor 304 to suggest furniture pieces for an actual space depicted in a user provided image, and then render a view that shows the suggested or user selected furniture pieces in the actual space.

Memory 306 and/or storage 308 may be further configured to store information and data used by processor 304. For instance, memory 306 and/or storage 308 may be configured to store various data received by interior design device 203, such as image 214, floor plan 216, user preference data, and trained learning models 212. Memory 306 and/or storage 308 may also be configured to store intermediate data generated by processor 304, such as point cloud data of various objects in image 214, attributes of furnishing objects selected for a space, structural data, furnishing information or remodeling information learned using learning models, remodeling or furnishing plans generated for a floor plan, and views rendered to visualize the remodeled or furnished/refurnished space. The various types of data may be stored permanently, removed periodically, or disregarded immediately after it is processed.

Figure 4:
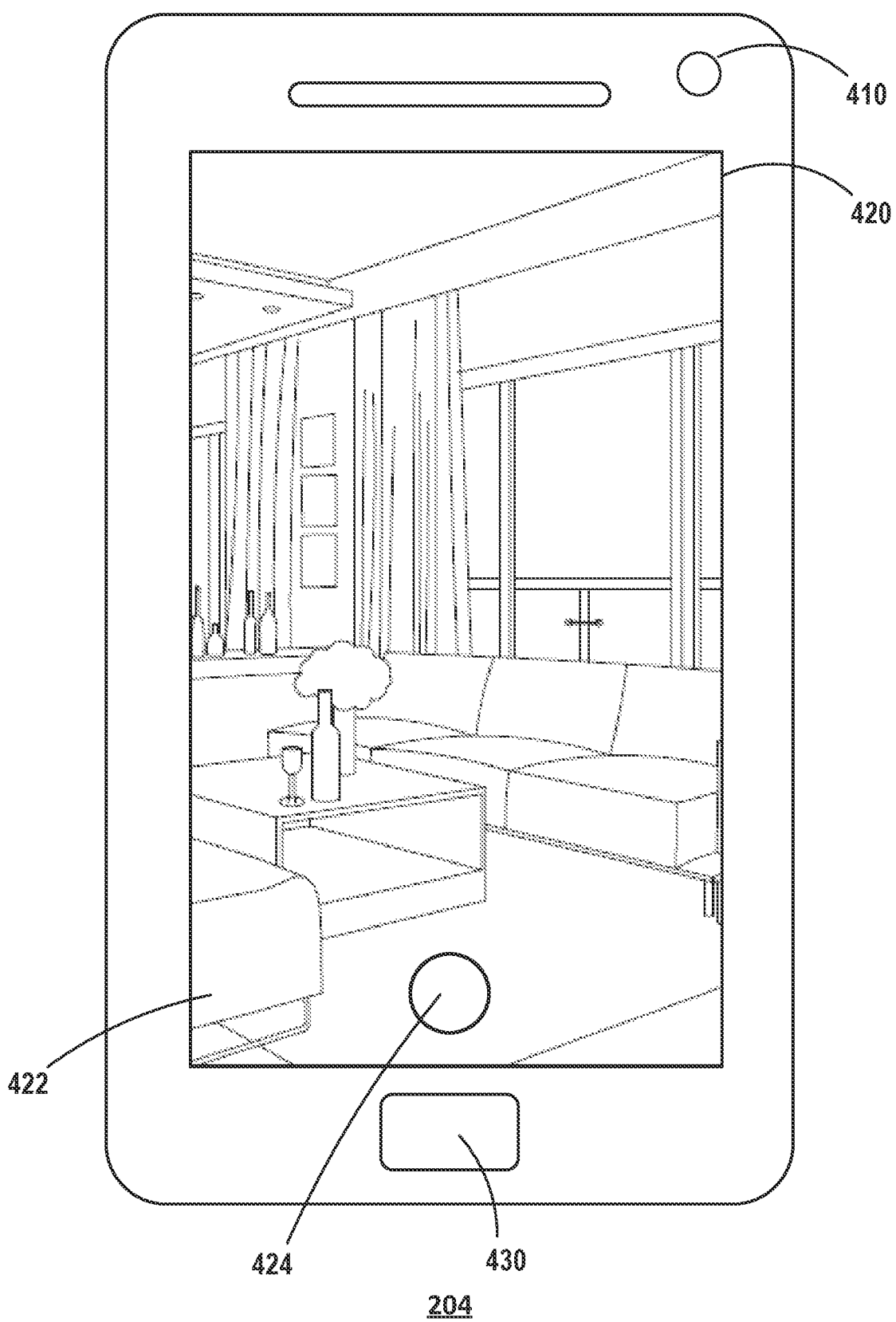
FIG. 4 illustrates an exemplary user device, according to embodiments of the disclosure.

FIG. 4 illustrates an exemplary user device 204, according to embodiments of the disclosure. In some embodiments, user device 204 may include an integrated camera 410 for capturing depth images. For example, camera 410 may be 3D scanner 205 described above. In some embodiments, display 420 may further function as a user interface to receive user input. As nonlimiting examples, display 420 may be a Liquid Crystal Display (LCD), a Light Emitting Diode Display (LED), a plasma display, or any other type of display. In some embodiments, user device 204 may further include a display 420 for displaying the captured image. Display 420 may include a number of different types of materials, such as plastic or glass, and may be touch-sensitive to receive commands from the user. For example, the display may include a touch-sensitive material that is substantially rigid, such as Gorilla Glass™, or substantially pliable, such as Willow Glass™.

Figure 5:
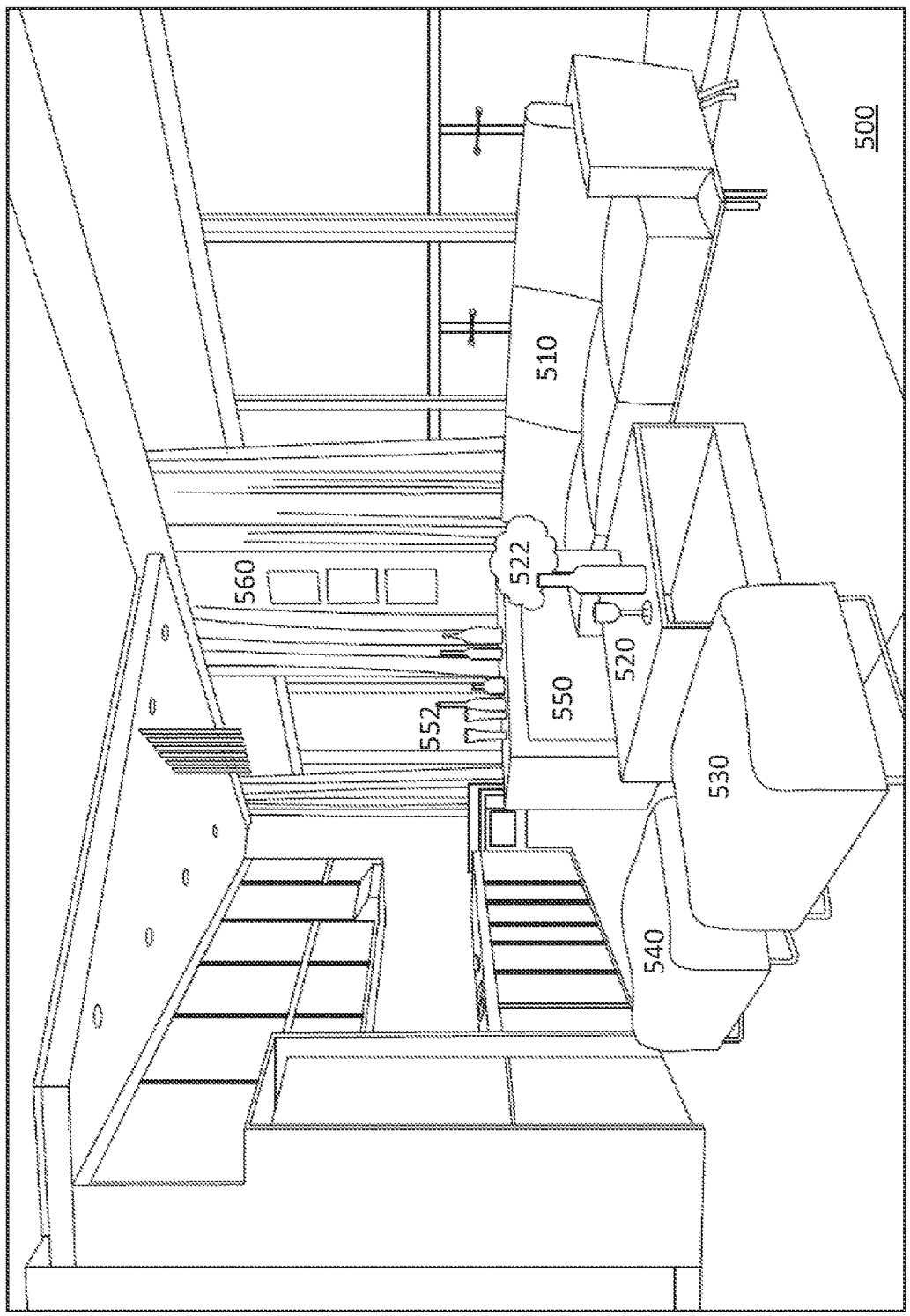
FIG. 5 is an exemplary image of an interior space showing furnishing objects, according to embodiments of the disclosure.

In some embodiments, display 420 may provide a Graphical User Interface (GUI) 422 presented on the display for user input and data display. For example, GUI 422 may display a soft button 424, for the user to press to capture the depth images. The user may hold user device 204 up so that camera 410 captures a view of property 100, and the view may be shown on display 420. When the view shows the desired orientation and objects, the user can press soft button 424 to capture the view as an image. For example, FIG. 5 is an exemplary image 500 of an interior space showing furnishing objects 510-560, according to embodiments of the disclosure. The interior space depicted by image 500 may be part of great room 110 in property 100 as shown in FIG. 1. Consistent with the present disclosure, furnishing objects may broadly include pieces of furniture and decorative items. As shown in FIG. 5, image 500 includes furnishing objects such as a couch 510, a coffee table 520 with a vase 522 placed thereon, a pair of ottomans 530 and 540, a console table 550 with decorative bottles 552 placed thereon, and pictures 560 hang on the wall.

User device 204 may further include various physical buttons for receiving different user inputs. For example, physical button 530 may be a home button, when pressed, return to the main menu where various applications are displayed. The user may select an application (e.g., an interior design application) to start the interior design process.

Interior design device 203, along with user device 204 and 3D scanner 205 (either integrated as camera 410 or external to user device 204), may be configured to perform methods for generating interior design plans/suggestions and visualizing such designs, such as those shown by flowcharts of FIGS. 6-12.

Figure 6:
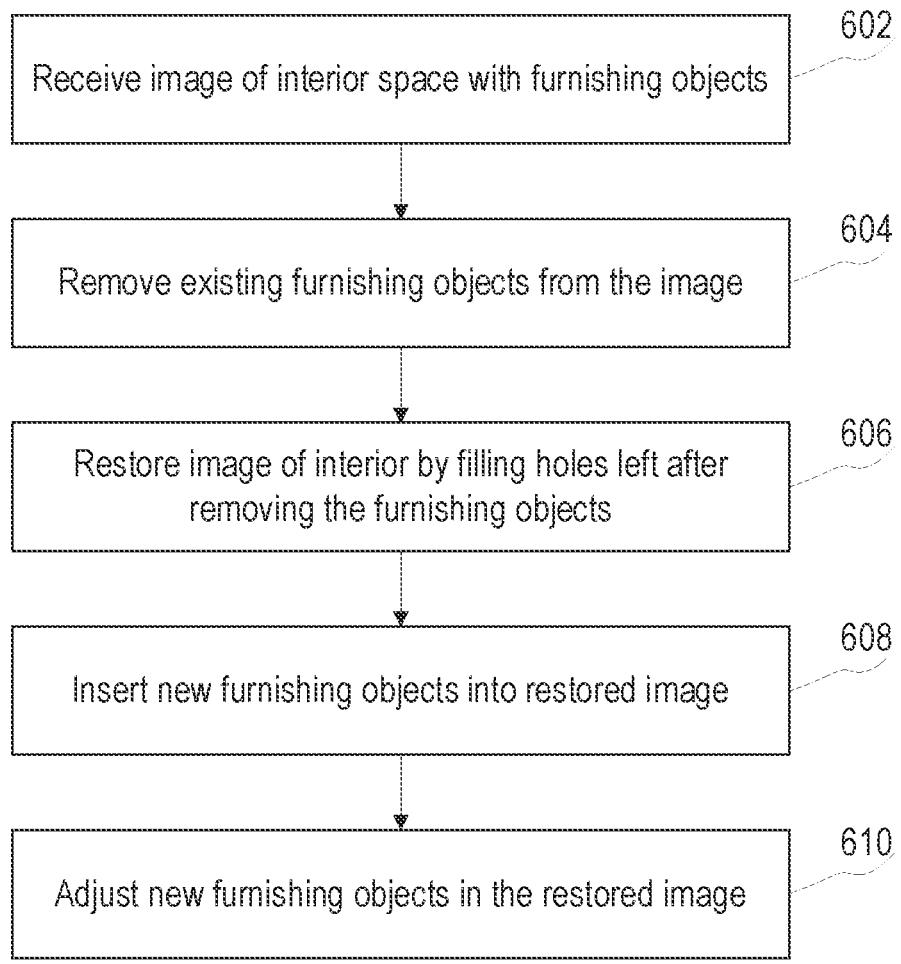
FIG. 6 is a flowchart of an exemplary method for visualizing furnishing objects in an image of an interior space, according to embodiments of the disclosure.

FIG. 6 is a flowchart of an exemplary method 600 for visualizing furnishing objects in an image of an interior space, according to embodiments of the disclosure. In some embodiments, method 600 may be performed by processor 304 of interior design device 203, e.g., furnishing unit 340 and view rendering unit 344. Method 600 may include steps 602-610 as described below. It is to be appreciated that some of the steps may be optional to perform the disclosure provided herein. Further, some of the steps may be performed simultaneously, or in a different order than shown in FIG. 6. For description purpose, method 600 will be described as to visualize image 500 and furnishing objects therein (as shown in FIG. 5). Method 600, however, can be implemented for visualizing furnishing of other spaces of a property.

In step 602, interior design device 203 may receive an image of an interior space with furnishing objects, such as image 500 with furnishing objects 510-560 as shown in FIG. 5. The image may be captured by 3D scanner 205 or camera 410 and may be selected to be sent by a user via user device 204. In some embodiments, the image may be a depth image that preserves depth information of the interior space.

In step 604, furnishing unit 340 may remove existing furnishing objects from the image. For example, some or all of furnishing objects 510-560 may be removed from image 500. In some embodiments, furnishing unit 340 may use object detection methods (such as convolutional neural network (CNN) based detection methods) to first detect the furnishing objects in the image, and then delete the corresponding pixels of those furnishing objects from the image. The CNN model may be part of learning models 212 trained by model training device 202. Deleting pixels may be implemented by replacing the pixel values with a predetermined value, such as 0. As a result of removing the furnishing objects, a blank region (or referred to a hole) where the furnishing objects used to occupy may be left in the image. The blank region defines the contour of the furnishing objects.

Figure 7:
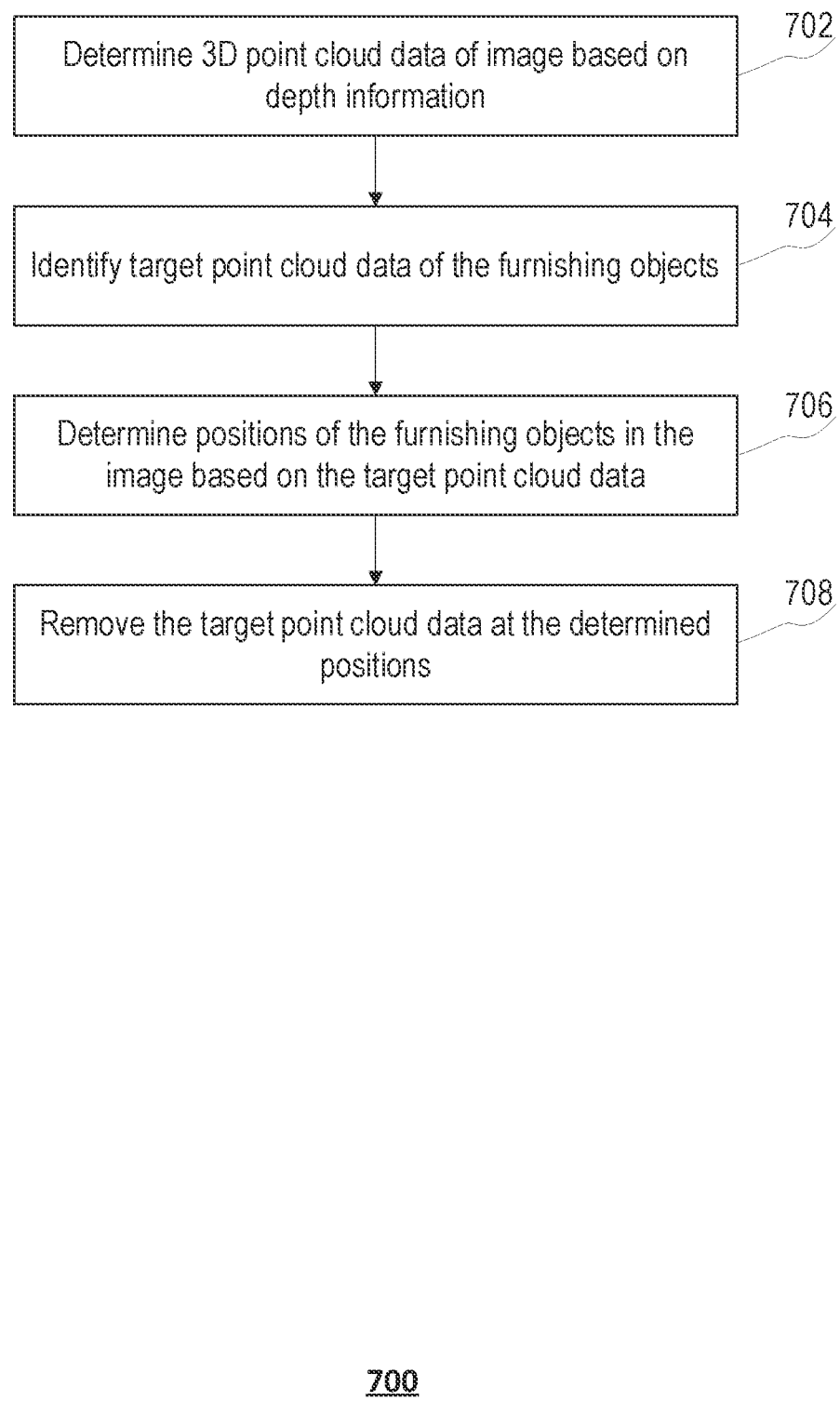
FIG. 7 is a flowchart of an exemplary method for removing existing furnishing objects in an image of an interior space, according to embodiments of the disclosure.

In some embodiments, FIG. 7 is a flowchart of an exemplary method 700 for removing existing furnishing objects in an image of an interior space, according to embodiments of the disclosure. In some embodiments, method 700 may also be implemented by furnishing unit 340 to perform step 604 of method 600. Method 700 may include steps 702-708 as described below. It is to be appreciated that some of the steps may be optional to perform the disclosure provided herein. Further, some of the steps may be performed simultaneously, or in a different order than shown in FIG. 7.

In step 702, furnishing unit 340 may determine 3D point cloud data of the image based on the depth information. In some embodiments, image 400 may be a depth image with a channel of depth information. The depth information indicates the distance between the view point (e.g., the position of 3D scanner 205) and each surface point the object being captured. Furnishing unit 340 may determine the 3D point cloud data of the image based on such distances. Each point cloud data point may be represented by a set of 3D coordinates.

In step 704, furnishing unit 340 may identify target point cloud data of the furnishing objects in the image. In some embodiments, the 3D point cloud data of the image may be segmented into several subsets, each corresponding to a furnishing object. For example, point cloud data corresponding to couch 510, coffee table 520, and pair of ottomans 530 and 540 may be segmented from the 3D point cloud data. Based on the user's selection of one or more furnishing objects, furnishing unit 340 may then select the corresponding subsets of point cloud data as the target point cloud data.

In step 706, furnishing unit 340 may determine positions of the furnishing objects in the image based on the target point cloud data. For example, positions of couch 510, coffee table 520, and pair of ottomans 530 and 540 may be determined based on the target point cloud data. In some embodiments, furnishing unit 340 may determine the contours of the furnishing objects using the target point cloud data, which define their positions. In some embodiments, contours of the furnishing objects may be learned using a learning model. The learning model may be part of learning models 212 trained by model training device 202 using training point cloud data of furnishing objects and their corresponding contour labels. For example, the training images may include various different styled or dimensioned couches and their contour labels, and the trained learning model may accordingly used to learn the contour of couch 510 from image 500.

In step 708, furnishing unit 340 may remove the furnishing objects from the image based on their determined positions. In some embodiments, furnishing unit 340 may reset the values of pixels within the determined contours to a predetermined value, e.g., 0 (corresponding to white color).

Returning to FIG. 6, in step 606, furnishing unit 340 may restore the image. In some embodiments, the image is restored by filling the blank region with a scene of the interior space that was previously blocked by the furnishing objects. For example, after removing couch 510 and console table 550 from image 500, the blank region left may be filled with the scene of walls, windows and curtains that were blocked by the removed objects. The blank region left by removing coffee table 520 and pair of ottomans 530 and 540 may be filled with a floor or carpet consistent with the flooring otherwise shown in the image.

In some embodiments, a neural network may be used to restore the image. In some embodiments, furnishing unit 340 may input the image obtained by step 604 into the trained neural network to obtain the restored image. The neural network extracts features from regions outside the blank region in the image to learn features in the blank region. The neural network for restoration may be part of learning models 212 trained by model training device 202. For example, the neural network may be trained using image inpainting algorithms based on pairs of sample images each including a furniture object removed image and its corresponding restored image. In some embodiments, the neural network can be trained using a gradient-decent method or a back-propagation method, which gradually adjust the network parameters to minimize the difference between the restored image output by the network and the ground-truth restored image provided as part of the training data. The training may be an iterative process ending upon at least one of the following conditions is satisfied: (1) training time exceeds a predetermined time length; (2) number of iterations exceed a predetermined iteration threshold; (3) a loss function (e.g., a cross-entropy loss function) calculated based on the restored image output by the network and the ground-truth restored image is smaller than a predetermined loss threshold. It is contemplated that the training may be performed "on-line" or "off-line."

In step 608, furnishing unit 340 may obtain and insert new furnishing objects into target positions of the restored image. In some embodiments, the target positions are where the positions of the removed furnishing objects. The target positions may be represented by coordinates in a coordinate system constructed using the center of the image as the origin. The new furnishing objects may be obtained from a local storage such as memory 306 or storage 308, or obtained remotely from a storage device via network 206. In some embodiments, the new furnishing objects may be selected or provided by the user via user device 204. In some embodiments, the new furnishing objects may be automatically selected by furnishing unit 340 and suggested to the user, as will be described in connection with FIG. 8 of this disclosure.

In step 610, furnishing unit 340 may adjust the inserted new furnishing objects in the restored image. In some embodiments, the dimensions of the new furnishing objects may be adjusted to target dimensions. For example, the target dimensions may be determined based on the size and shape of the removed furnishing objects. As a result, the inserted new furnishing objects may fit into the area where the removed furnishing objects previously occupied. Specifically, furnishing unit 340 may construct a 3D model for the new furnishing object based on its dimensions determined based on the point cloud data of the furnishing object. Furnishing unit 340 then adjusts the size of the 3D model to fit it into the "hole" left from removing the furnishing objects in the 3D point cloud data. Accordingly, the target dimensions of the new furnishing object may conform to the 3D dimensions of the target point cloud data of the removed furnishing objects.

In some other embodiments, the target dimensions may be determined based on the ratio between the physical dimensions of the removed furnishing pieces and the physical dimensions of the space captured by the image. For example, the height of the inserted new furnishing object is 1 meter, and the height of the imaged space is 3 meters, the inserted new furnishing object may be adjusted to be ⅓ of the size of the image.

View rendering unit 344 may render a 3D view of the space with the new furnishing objects and send the view to user device 204 for display. By adjusting the dimensions of the inserted furnishing objects, the furnishing objects may blend well in the imaged space. Accordingly, the visualization of the refurnished space may be closer to reality.

Figure 8:
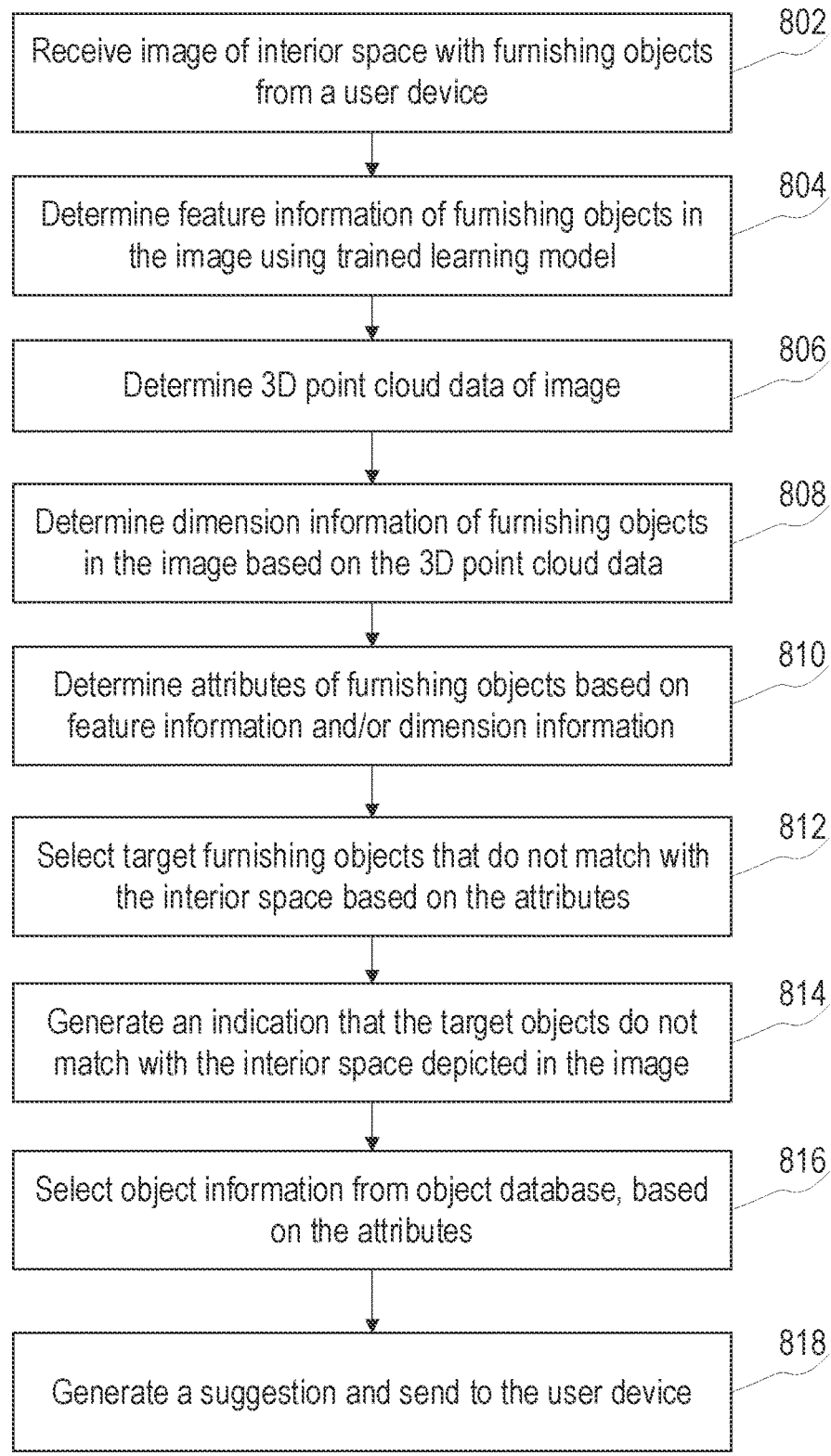
FIG. 8 is a flowchart of an exemplary method for suggesting new furnishing objects for an interior space, according to embodiments of the disclosure.

FIG. 8 is a flowchart of an exemplary method 800 for suggesting new furnishing objects for an interior space, according to embodiments of the disclosure. In some embodiments, method 800 may be performed by processor 304 of interior design device 203, e.g., furnishing unit 340 and view rendering unit 344. Method 800 may include steps 802-818 as described below. It is to be appreciated that some of the steps may be optional to perform the disclosure provided herein. Further, some of the steps may be performed simultaneously, or in a different order than shown in FIG. 8. For description purpose, method 600 will also be described as to furnishing the space depicted by image 500 (as shown in FIG. 5). Method 800, however, can be implemented for furnishing other spaces of a property.

In step 802, interior design device 203 may receive an image of an interior space with furnishing objects, such as image 500 with furnishing objects 510-560 as shown in FIG. 5, similar to step 602.

In step 804, furnishing unit 340 may determine feature information of furnishing objects in the image using a learning model. For example, feature information of furnishing objects 510-560 in image 500 may be learned. Consistent with the disclosure, feature information may be features that define the furnishing objects, such as their categories, styles, dimensions, and functions, etc. In some embodiments, furnishing unit 340 may use object detection methods (such as neural network based object detectors) to detect the furnishing objects and their features.

The neural network may learn the mapping between images and features of furnishing objects. In some embodiments, the neural network may be trained by model training device 202 using a Single Shot MultiBox Detector (SSD) or a Deformable Part Model (DPM) as an initial model. The initial model is then adjusted (by adjusting the model parameters) during training. The neural network may be trained using sample images and ground-truth object features. During each iteration of the training process, the training images are input into the model, and the output features from the model are compared with the ground-truth object features. The model parameters are adjusted based on a difference between the two. The training ends upon satisfying at least one of the following stopping criteria: (1) training time exceeds a predetermined time length; (2) number of iterations exceed a predetermined iteration threshold; (3) a loss function (e.g., a cross-entropy loss function) calculated based on the output features from the model and the ground-truth object features is smaller than a predetermined loss threshold. It is contemplated that the training may be performed "on-line" or "off-line."

In step 806, furnishing unit 340 determines 3D point cloud data of the image based on the depth information. In some embodiments, image 400 may be a depth image with a channel of depth information. The depth information indicates the distance between the view point (e.g., the position of 3D scanner 205) and each surface point the object being captured. Furnishing unit 340 may determine the 3D point cloud data of the image based on such distances. Each point cloud data point may be represented by a set of 3D coordinates.

In step 808, furnishing unit 340 determines dimension information of furnishing objects in the image based on the 3D point cloud data. In some embodiments, the 3D point cloud data may be segmented into several subsets, each corresponding to a furnishing object. Furnishing unit 340 may determine the dimension information of each furnishing objects based on the 3D coordinates of the data points within the corresponding subset of point cloud data.

In step 810, furnishing unit 340 may determine attributes of the furnishing objects based on the feature information determined in step 804 and/or dimension information determined in step 808. In some embodiments, the attributes may be the feature information, the dimension information, or a combination of both. In some embodiments, the attributes may further include other information of the furnishing object, such as model number, product number (e.g., UPC), and product name, etc.

In step 812, furnishing unit 340 may select target furnishing objects that do not match with the interior space based on their attributes. In some embodiments, furnishing unit 340 may determine whether a furnishing object matches with the interior space based on style. As described in step 810, style of the furnishing object may be part of its feature information included as its attributes. Exemplary styles of a furnishing object may include European style, oriental style, contemporary style, modern style, etc. In some embodiments, the style of a furnishing object can be learned by the object detection learning network described in step 804. For example, couch 510, coffee table 520, and pair of ottomans 530 and 540 may be all contemporary style. Style of the interior space may be defined collectively by the styles of furnishing objects within that space. For example, if most the furnishing objects are oriental style, the interior space is determined to be oriental style. Because furnishing objects 510-540 are all contemporary style, the interior space depicted by image 500 therefore is also contemporary style. Furnishing unit 340 may then compare the style of each furnishing object and the style of the interior space to determine whether the match. If a furnishing object is oriental style but the interior space is contemporary style, the furnishing object is identified as a target furnishing object that does not match.

In some embodiments, furnishing unit 340 may determine whether a furnishing object matches with the interior space based on its dimensions. As described in step 810, dimension information of the furnishing object may also be included as its attributes. In some embodiments, if the dimensions of a furnishing object are larger than the unoccupied size of the interior space, the furnishing object can be determined as a target furnishing object that does not match the interior space. In some alternative embodiments, furnishing unit 340 may consider the combination of feature information (e.g., style) and dimension information when selecting mismatched furnishing objects.

In step 814, furnishing unit 340 may generate an indication the target objects do not match with the interior space depicted in the image. In some embodiments, the indication can be in the form of at least one of an image, a text, an audial signal, etc. For example, the indication may be a text message that "The furniture style does not match with the room. Please consider replace it." As another example, the indication may be an image of the room with the mismatched furniture highlighted. As yet another example, the indication may be a voice message identifying the mismatched furniture. In some embodiments, the indication may include more than one form, such as an image paired with a text message. The indication may be sent to user device 204 for display to the user.

In step 816, furnishing unit 340 may select object information from its object database based on the attributes. Consistent with the present disclosure, object information may include at least one of object name, category, image, and place of origin, etc. For example, the object information may include the feature information of furnishing objects. In some embodiments, the object database may be stored locally in interior design device 203, e.g., in memory 306 or storage 308. In some other embodiments, the object database may be stored remotely from interior design device 203, e.g., in the cloud.

In some embodiments, the object information may be selected according to the style of the interior space determined as in step 812. For example, the object information may be the feature information of furnishing objects that have the same style as that of the interior space. As one example, if the interior space is oriental style, furnishing unit 340 may select furnishing objects of oriental style and select the other feature information (e.g., object name, category, image, and place of origin) of those furnishing objects as the object information.

In some embodiments, the object information may be selected according to the dimensions of the interior space. For example, the object information may be the feature information of furnishing objects that have the right sizes that fit within the dimensions of the interior space. In some embodiments, furnishing unit 340 may determine a range of object dimensions based on the image dimensions and predetermined first ratio (used to determine the lower limit of the range) and second ratio (used to determine the upper limit of the range). Object information of furnishing objects that have dimensions falling in the range is selected by furnishing unit 340. In some alternative embodiments, furnishing unit 340 may consider the combination of feature information (e.g., style) and dimension information when selecting object information.

In step 818, furnishing unit 340 may generate a suggestion according to the object information. In some embodiments, the indication can be in the form of at least one of an image, a text, an audial signal, etc. For example, the indication may be a text message showing the object information (e.g., object name, category, image, and place of origin). As another example, the indication may be an image of the room with suggested furnishing objects that satisfy the object information. Furnishing unit 340 may identify suitable furnishing objects based on the object information and replace the mismatched furnishing objects with the new furnishing objects in the image by performing, e.g., method 600. As yet another example, the indication may be a voice message explaining the object information. In some embodiments, the indication may include more than one form, such as an image paired with a text message. The suggestion may be sent to user device 204 for display to the user.

Figure 9:
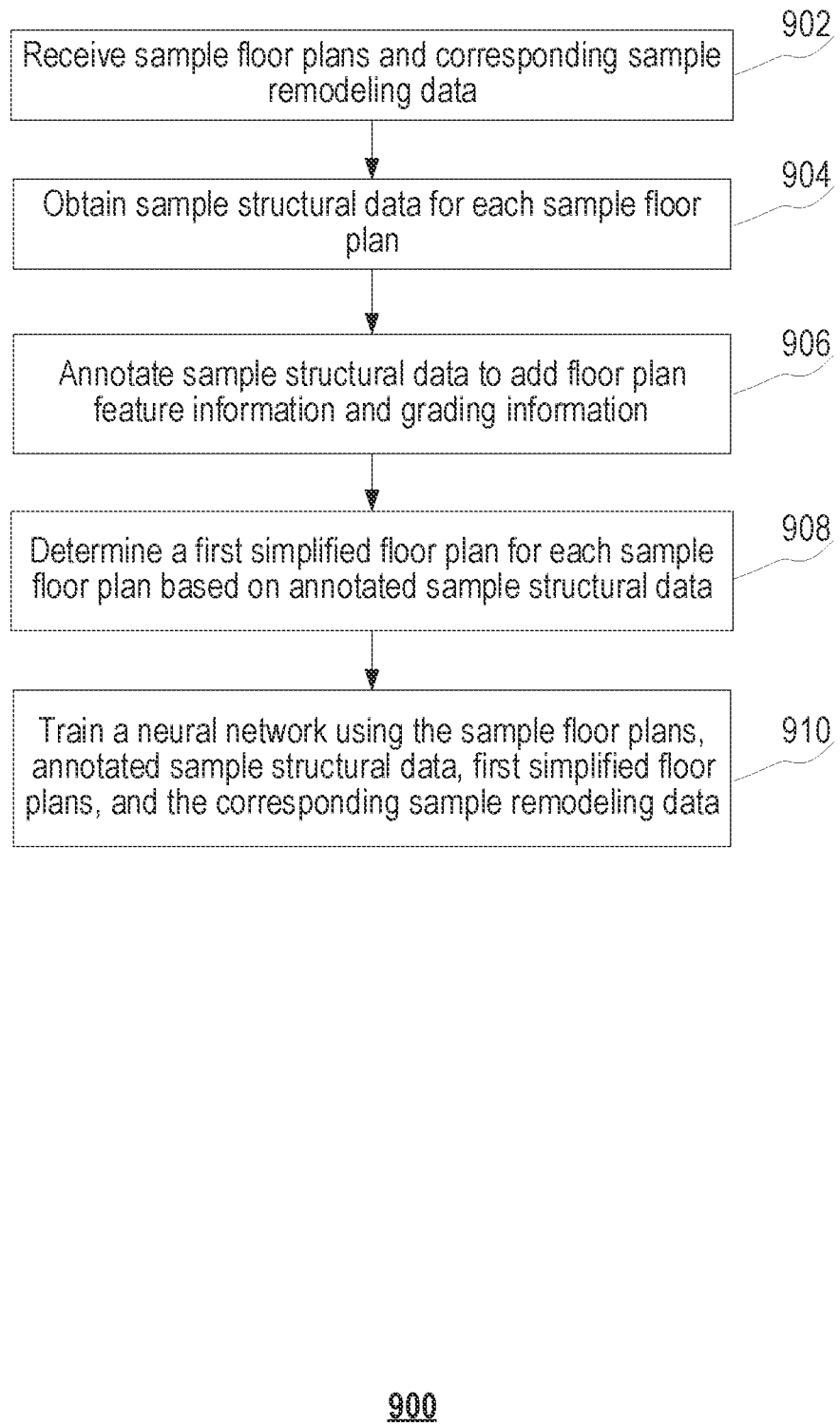
FIG. 9 is a flowchart of an exemplary method for training a neural network for learning remodeling information for a property, according to embodiments of the disclosure.

FIG. 9 is a flowchart of an exemplary method 900 for training a neural network for learning remodeling information for a property, according to embodiments of the disclosure. In some embodiments, method 900 may be performed by model training device 202. Method 900 may include steps 902-910 as described below. It is to be appreciated that some of the steps may be optional to perform the disclosure provided herein. Further, some of the steps may be performed simultaneously, or in a different order than shown in FIG. 9.

In step 902, model training device 202 receives sample floor plans and corresponding sample remodeling data. For example, model training device 202 may receive such training data from training database 201. A floor plan may be a drawing that describes the structure and layout of a property. For example, the floor plan may describe the structures that divide property 100 into different functional rooms 110-130, and the detailed shape and dimensions of each room. In some embodiments, the sample floor plans may be generated by Computer-Aided Design (CAD) modeling tools. Each sample floor plan may show structures such as walls, counters, stairs, windows, and doors, etc. In some embodiments, the sample floor plan may be a vector graph.

The corresponding sample remodeling data may include structural remodeling information. In some embodiments, the structural remodeling may include, e.g., to knock down a wall, to reduce a wall to a half wall, to add a wall, to move a wall to a different place, to remove/expand/insert a window, or to remove/insert a door, etc. Accordingly, the sample remodeling data may include the identity of each structure for remodeling, and descriptions of the remodeling, including, e.g., position of the structure, dimensions of the structure before and after the remodeling, etc. In some embodiments, the structural remodeling information may further include a structural heat map. The structural heat map reflects the structures (e.g., walls, windows, doors, etc.) for remodeling and the respective probabilities the structures need to be remodeled.

In step 904, model training device 202 may obtain sample structural data corresponding to the sample floor plan. In some embodiments, the sample floor plan may contain corresponding structural data including, e.g., wall distribution data, weight-bearing wall distribution data, window/door distribution data, area data, ceiling height data, structure position coordinates, etc.

In step 906, model training device 202 may annotate the sample structural data to add information, such as floor plan feature information and/or grading information. In some embodiments, the floor plan feature information may include, e.g., spaciousness, number of occupants, storage space, lighting condition, year the property was built, etc. In some embodiments, the sample structural data may be graded to generate the grading information. For example, the weight-bearing wall distribution or the window/door distribution may be graded. In some embodiments, the grading information may be a number (e.g., on a scale of 0-100) or a grade level (e.g., A-F) indicating the quality of the structural data. The feature information and grading information may be annotated on the respective structure in the sample floor plan or added to the corresponding sample structural data.

In step 908, model training device 202 may determine a first simplified floor plan based on the annotated structural data. In some embodiments, model training device 202 may identify the weight-bearing walls based on the sample structural data, in particular, the weight-bearing wall distribution data. Model training device 202 then determines the first simplified floor plan according to the weight-bearing walls. For example, the first simplified floor plan may only include the weight-bearing walls, as well as windows and doors on those weight-bearing walls. If there is no weight-bearing wall in the sample floor plan, the first simplified floor plan may be set as the originally received sample floor plan.

In step 910, model training device 202 may train a neural network for learning remodeling information. In some embodiments, the neural network may be trained using sample floor plans (with their derived sample structural data and first simplified floor plans) and their corresponding sample remodeling data. In some embodiments, the neural network is trained for a remodeling preference. For example, the remodeling preference may be to increase the storage space in the property, or to improve the overall living experience (e.g., more comfortable). Accordingly, the neural network may be trained using a loss function that reflects the remodeling preference. For example, the loss function may be calculated as the collective area of storage space in the property when the remodeling preference is set to increase the storage space.

In some embodiments, the training may be an iterative process. At each iteration, the neural network generates structural remodeling information based on the sample floor plan, the structural data and the simplified floor plan. In some embodiments, the neural network can be trained using a gradient-decent method or a back-propagation method, which gradually adjust the network parameters to minimize the difference between the structural remodeling information output by the network and the ground-truth sample remodeling data provided as part of the training data in step 902. The training may end upon at least one of the following conditions is satisfied: (1) training time exceeds a predetermined time length; (2) number of iterations exceed a predetermined iteration threshold; (3) a loss function (e.g., a cross-entropy loss function) calculated based on the structural remodeling information output by the network and the ground-truth remodeling data is smaller than a predetermined loss threshold. It is contemplated that the training may be performed "on-line" or "off-line."

In some embodiments, the neural network may adopt any suitable structure, such as a floornet model. The neural network may include an input layer, an intermediate layer and an output layer, each layer receives the output of its previous layer as its input. In some embodiments, the intermediate layer may be a convolution layer. In some embodiments, the intermediate layer may be a fully connected layer.

Figure 10:
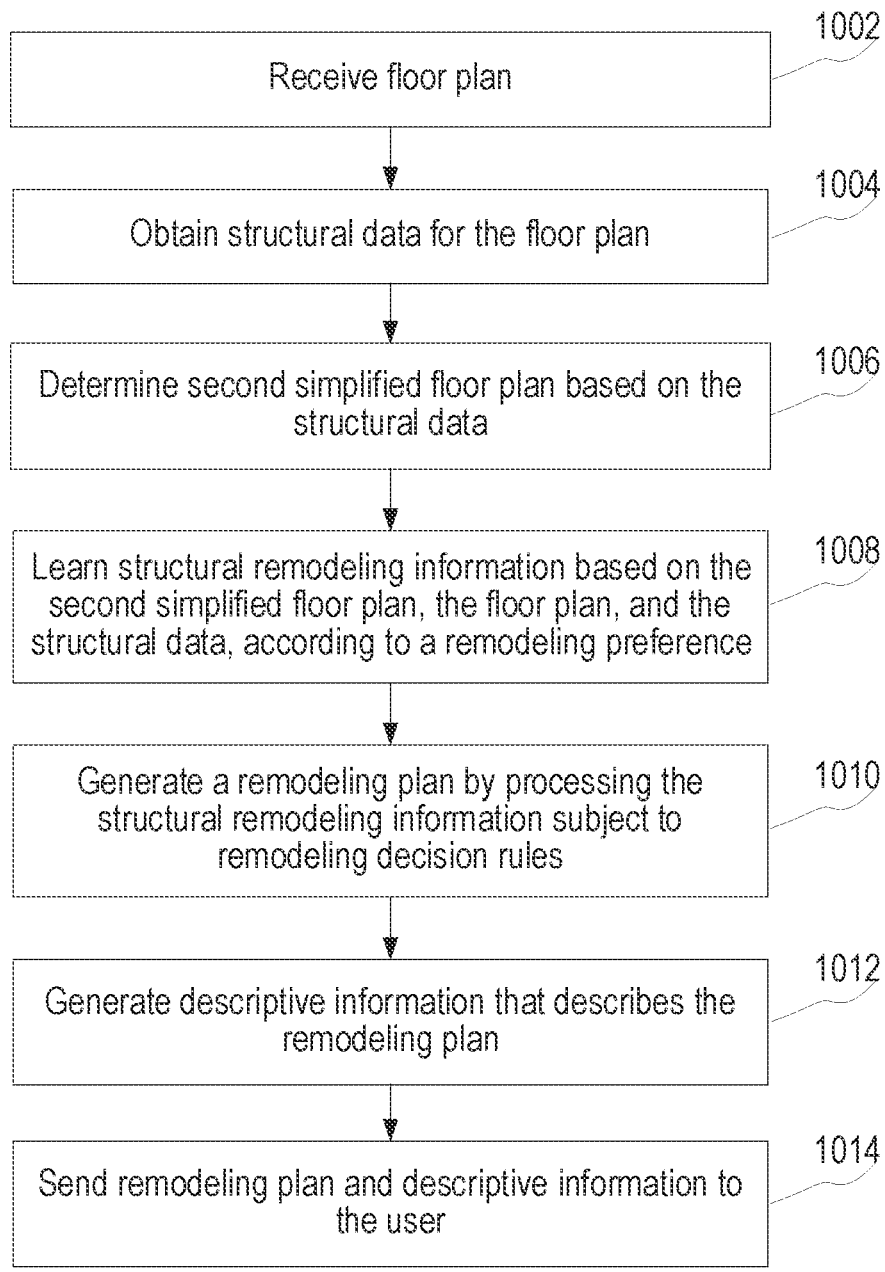
FIG. 10 is a flowchart of an exemplary method for generating a remodeling plan for a property, according to embodiments of the disclosure.

FIG. 10 is a flowchart of an exemplary method 1000 for generating a remodeling plan for a property, according to embodiments of the disclosure. In some embodiments, method 1000 may be performed by processor 304 of interior design device 203, e.g., remodeling unit 342 and view rendering unit 344. Method 1000 may include steps 1002-1014 as described below. It is to be appreciated that some of the steps may be optional to perform the disclosure provided herein. Further, some of the steps may be performed simultaneously, or in a different order than shown in FIG. 10. For description purpose, method 1000 will be described using property 100 (as shown in FIG. 1) as an example. Method 1000, however, can be implemented for remodeling other spaces or other properties.

In step 1002, remodeling unit 342 receives a floor plan that needs remodeling. For example, remodeling unit 342 may receive floor plan 216 provided by the user via user device 204. Floor plan 216 may be a drawing that describes the structure and layout of a property. For example, floor plan 216 may describe the structures that divide property 100 into different functional rooms 110-130, and the detailed shape and dimensions of each room. Floor plan 216 may show structures such as walls, counters, stairs, windows, and doors, etc. In some embodiments, floor plan 216 may be a vector graph generated by CAD modeling tools.

In step 1004, remodeling unit 342 may obtain structural data corresponding to the floor plan. In some embodiments, floor plan 216 may contain corresponding structural data including, e.g., wall distribution data, weight-bearing wall distribution data, window/door distribution data, area data, ceiling height data, structure position coordinates, etc.

In step 1006, remodeling unit 342 may determine a second simplified floor plan based on the structural data. In some embodiments, remodeling unit 342 may identify the weight-bearing walls of the property based on the structural data, in particular, the weight-bearing wall distribution data. Remodeling unit 342 then determines the second simplified floor plan according to the weight-bearing walls. For example, the second simplified floor plan may only include the weight-bearing walls, as well as windows and doors on those weight-bearing walls. If there is no weight-bearing wall in the property, the second simplified floor plan may be set as the originally received floor plan.

In step 1008, remodeling unit 342 may learn structural remodeling information based on the second simplified floor plan, the originally received floor plan, and the structural data. In some embodiments, the structural remodeling information may be learned by applying the neural network trained using method 900. The structural remodeling information may include the identity of each structure for remodeling, descriptions of the remodeling, including, e.g., position of the structure, dimensions of the structure before and after the remodeling, and the corresponding structural heat map, etc.

In some embodiments, the structural remodeling information is generated according to a remodeling preference, e.g., provided by the user via user device 204. For example, the remodeling preference may be to increase the storage space in the property, or to improve the overall living experience (e.g., more comfortable). Accordingly, a neural network trained to reflect the remodeling preference may be used in step 1008.

In step 1010, remodeling unit 342 may generate a remodeling plan based on the structural remodeling information. In some embodiments, remodeling unit 342 may process the structural remodeling information subject to certain predetermined remodeling decision rules (e.g., construction regulations) when generating the remodeling plan. In some embodiments, remodeling unit 342 may use the remodeling decision rules as constraints for optimizing the structural remodeling information. For example, a Monte-Carlo search tree (MCST) algorithm may be used.

In some embodiments, the remodeling decision rules may be predetermined. For example, the pivot point of each structure, determined using, e.g., Integer Programing, may be used as a constraint. Accordingly, a Monte-Carlo search tree may be constructed using the structures in the heat map as tree nodes. The MCST algorithm then traverses the learned structural heat map by traversing the tree nodes, in order to identify structures (e.g., walls, windows, or doors) for remodeling. The identified structures have to satisfy all the remodeling decision rules and maximize the overall remodeling probability of the remodeling plan. The overall remodeling probability of the remodeling plan may be the sum or the weighted sum of respective probabilities (according to the heat map) of the structures identified for remodeling.

After the structures for remodeling are identified, the remodeling plan may be generated according to the remodeling information. In some embodiments, the remodeling plan may include an adjusted floor plan that reflects the remodeled property.

In step 1012, remodeling unit 342 may further generate descriptive information that describes the remodeling plan. In some embodiments, remodeling unit 342 may compare the original floor plan and the remodeling plan and generate the descriptive information according to the difference. For example, the descriptive information may describe the structural changes that should be made, e.g., to knock down a wall, to reduce a wall to a half wall, to add a wall, to move a wall to a different place, to remove/expand/insert a window, or to remove/insert a door, etc. The descriptive information may further include information related to the remodeling projection, such as the construction materials necessary for the remodeling, and expected time needed for complete the remodeling.

In step 1014, remodeling unit 342 may send the remodeling plan and the descriptive information to the user. For example, the remodeling plan and the descriptive information may be sent to user device 204 for display.

Figure 11:
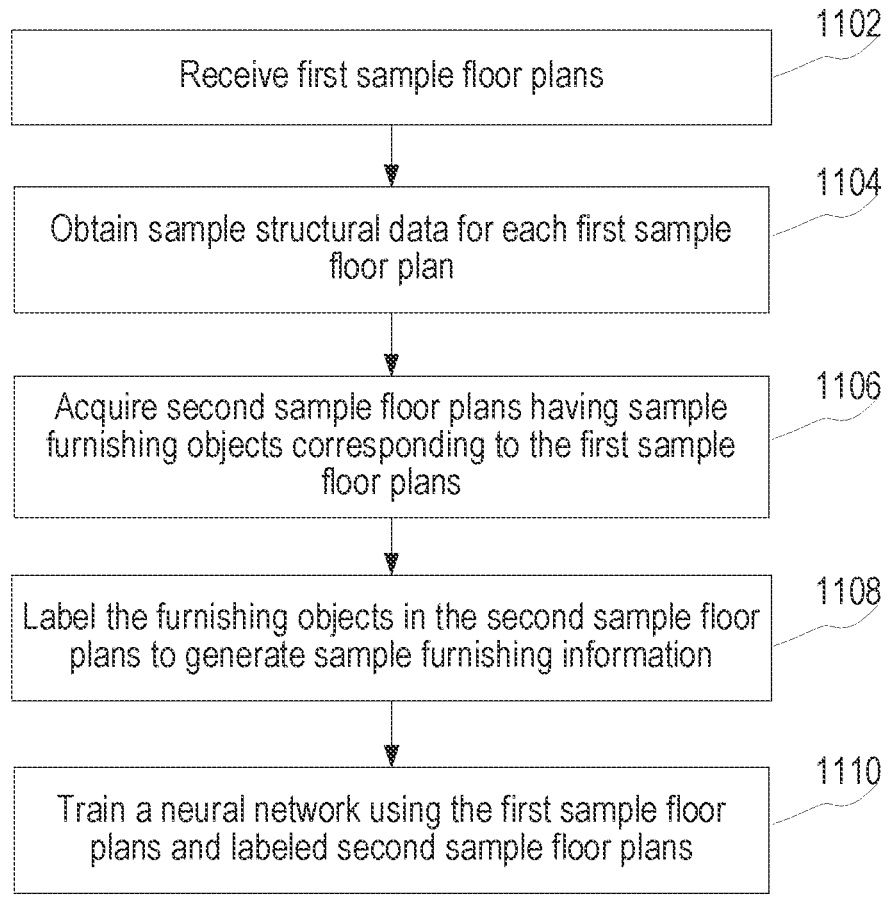
FIG. 11 is a flowchart of an exemplary method for training a neural network for learning furnishing information for a property, according to embodiments of the disclosure.

FIG. 11 is a flowchart of an exemplary method 1100 for training a neural network for learning furnishing information for a property, according to embodiments of the disclosure. In some embodiments, method 1100 may be performed by model training device 202. Method 1100 may include steps 1102-1110 as described below. It is to be appreciated that some of the steps may be optional to perform the disclosure provided herein. Further, some of the steps may be performed simultaneously, or in a different order than shown in FIG. 11.

In step 1102, model training device 202 receives first sample floor plans. For example, model training device 202 may receive the first sample floor plans from training database 201. A floor plan may be a drawing that describes the structure and layout of a property. For example, the floor plan may describe the structures that divide property 100 into different functional rooms 110-130, and the detailed shape and dimensions of each room. In some embodiments, the first sample floor plans may be generated by Computer-Aided Design (CAD) modeling tools. Each sample floor plan may show structures such as walls, counters, stairs, windows, and doors, etc. In some embodiments, the sample floor plan may be a vector graph.

In step 1104, model training device 202 may obtain sample structural data corresponding to the first sample floor plans. In some embodiments, the sample floor plan may contain corresponding structural data including, e.g., wall distribution data, weight-bearing wall distribution data, window/door distribution data, area data, ceiling height data, structure position coordinates, etc.

In step 1106, model training device 202 may acquire second sample floor plans corresponding to the first sample floor plans. In some embodiments, the second sample floor plans may be identical or similar in layout, structure, and size as the corresponding first sample floor plans. The second sample floor plans may be identified using the structural data of the first sample floor plans. In some embodiments, the first sample floor plans may be furnished or unfurnished, but the corresponding second sample floor plans are furnished with one or more furnishing objects. For example, a second sample floor plan may be similar to what is shown in FIG. 1. The furnishing objects may be pieces of furniture, e.g., dining set 113, TV stand 114, living room set 115, bed 131, and rocking chair 133, or decorative objects, e.g., plants 116 and pictures 132.

In step 1108, model training device 202 may label the furnishing objects in the second sample floor plans to generate sample furnishing information. In some embodiments, the furnishing objects may be manually labeled. The sample furnishing information may include, e.g., category of the furnishing object, position in the floor plan, orientation of placement, style, and dimensions, etc. In some embodiments, the sample furnishing information may further include grading information. For example, the grading information may be a number (e.g., on a scale of 0-100) or a grade level (e.g., A-F). In some embodiments, the furnishing information may further include a furnishing heat map. The furnishing heat map reflects the placement of furnishing objects and the respective probabilities the furnishing objects will be placed at the respective positions. For example, the furnishing heat map shows the recommended placement of dining set 113 and living room set 115 in great room 110, the probabilities dining set 113 and living room set 115 be placed at those positions, and other information of dining set 113 and living room set 115.

In step 1110, model training device 202 may train a neural network for learning furnishing information. In some embodiments, the neural network may be trained using the first sample floor plans and the sample furnishing information generated form their corresponding second sample floor plans. In some embodiments, the training may be an iterative process. At each iteration, the neural network generates output furnishing information based on the first sample floor plans and their structural data. In some embodiments, the neural network can be trained using a gradient-decent method or a back-propagation method, which gradually adjust the network parameters to minimize the difference between the furnishing information output by the network when applied to the first sample floor plans and the sample furnishing information generated from the corresponding second sample floor plans in step 1108. The training may end upon at least one of the following conditions is satisfied: (1) training time exceeds a predetermined time length; (2) number of iterations exceed a predetermined iteration threshold; (3) a loss function (e.g., a cross-entropy loss function) calculated based on the furnishing information output by the network when applied to the first sample floor plans and the sample furnishing information generated from the corresponding second sample floor plans is smaller than a predetermined loss threshold. It is contemplated that the training may be performed "on-line" or "off-line."

In some embodiments, the neural network may adopt any suitable structure, such as a ResNet/DenseNet model. ResNet (Residual Neural Network) can expedite the training as well as improve the learning accuracy of the network. The neural network may include an input layer, an intermediate layer and an output layer, each layer receives the output of its previous layer as its input. In some embodiments, the intermediate layer may be a convolution layer. In some embodiments, the intermediate layer may be a fully connected layer.

Figure 12:
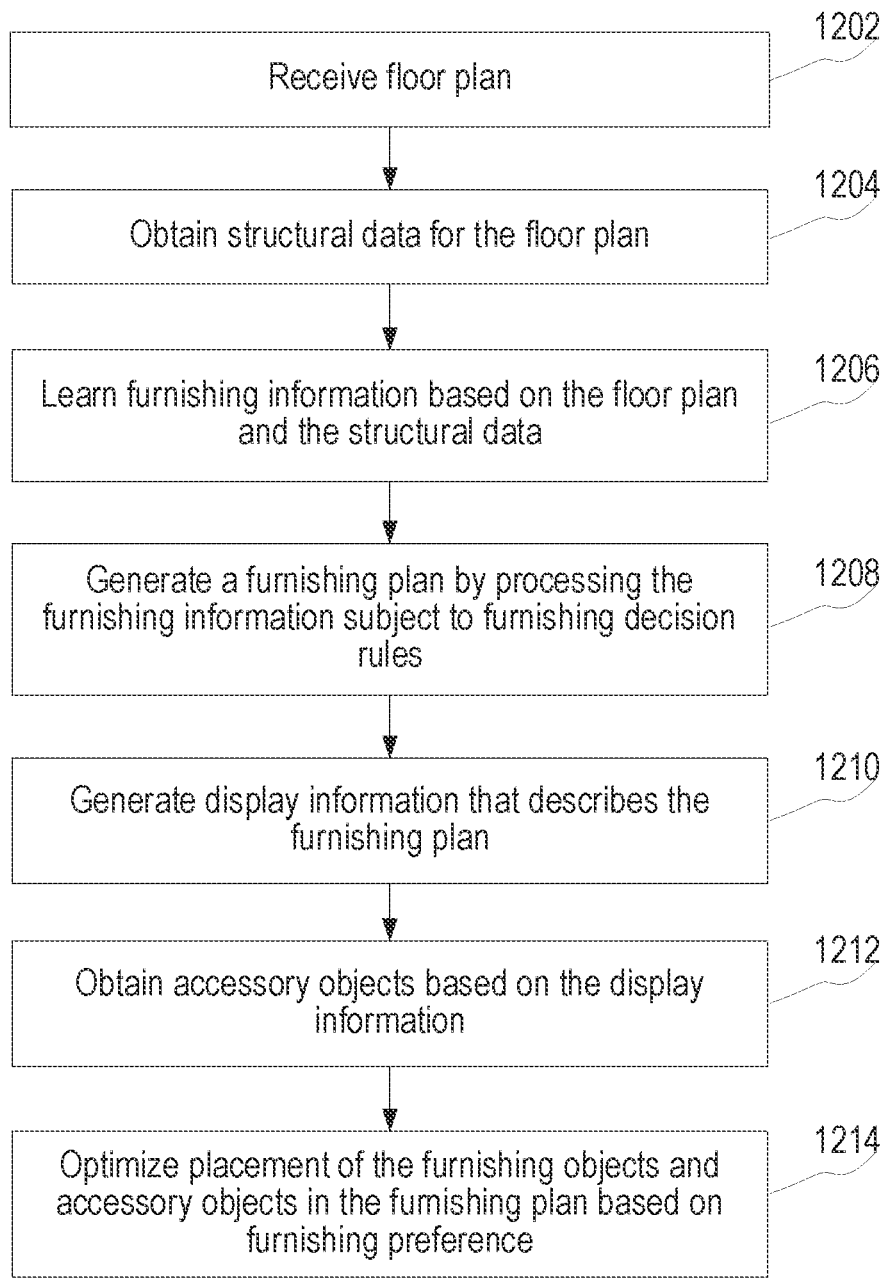
FIG. 12 is a flowchart of an exemplary method for generating a furnishing plan for a property, according to embodiments of the disclosure.

FIG. 12 is a flowchart of an exemplary method 1200 for generating a furnishing plan for a property, according to embodiments of the disclosure. In some embodiments, method 1200 may be performed by processor 304 of interior design device 203, e.g., furnishing unit 340. Method 1200 may include steps 1202-1214 as described below. It is to be appreciated that some of the steps may be optional to perform the disclosure provided herein. Further, some of the steps may be performed simultaneously, or in a different order than shown in FIG. 12. For description purpose, method 1200 will be described using property 100 (as shown in FIG. 1) as an example. Method 1200, however, can be implemented for furnishing other spaces or other properties.

In step 1202, furnishing unit 340 receives a floor plan. The floor plan may be furnished or unfurnished. For example, furnishing unit 340 may receive floor plan 216 provided by the user via user device 204. Floor plan 216 may be a drawing that describes the layout, structure, and size of a property. In some embodiments, the floor plan may be a vector graph generated by CAD modeling tools.

In step 1204, furnishing unit 340 may obtain structural data corresponding to the floor plan. In some embodiments, floor plan 216 may contain corresponding structural data including, e.g., wall distribution data, weight-bearing wall distribution data, window/door distribution data, area data, ceiling height data, structure position coordinates, etc.

In step 1206, furnishing unit 340 may learn furnishing information based on the floor plan and the structural data. In some embodiments, the furnishing information may be learned by applying the neural network trained using method 1100. The furnishing information may include, e.g., category of the furnishing object recommended for placing in the floor plan, position of each furnishing object in the floor plan, orientation of placement, style, and dimensions, etc. In some embodiments, the learned furnishing information may further include a furnishing heat map.

In step 1208, furnishing unit 340 may generate a furnishing plan by processing the furnishing information. In some embodiments, furnishing unit 340 may process the furnishing information subject to certain predetermined furnishing decision rules when generating the furnishing plan. In some embodiments, furnishing unit 340 may use the furnishing decision rules as constraints for optimizing the furnishing plan. For example, an MCST algorithm may be used.

In some embodiments, the furnishing decision rules may be predetermined. For example, an energy function $E(x)$ may be constructed based on the placement positions and the furnishing objects to be placed, and the energy function $\min(\Sigma E(x))$ may be used as a constraint. The energy function may consider the position of each furnishing object relative to the walls and relative to other furnishing objects. As another example, the total number of the furnishing objects may be another constraint. Accordingly, a Monte-Carlo search tree may be constructed using the placed furnishing objects in the heat map as tree nodes. The MCST algorithm then traverses the learned furnishing heat map by traversing the tree nodes, in order to identify the furnishing objects and their placement positions in the floor plan. The placement has to satisfy all the furnishing decision rules and maximize the overall placement probability of the furnishing plan. The overall placement probability of the furnishing plan may be the sum or the weighted sum of respective probabilities (according to the heat map) of the furnishing objects.

After the furnishing objects for placement and their respective placement positions are identified, the furnishing plan may be generated according to the furnishing information. In some embodiments, the furnishing plan may include a graphic illustration of the furniture placement in the floor plan.

In step 1210, furnishing unit 340 may further generate display information that describes the furnishing plan. In some embodiments, the descriptive information may include the furnishing information of each furnishing object selected for placement in the floor plan, e.g., category of the furnishing object, position of the furnishing object in the floor plan, orientation of placement, style, and dimensions of the furnishing object, etc.

In step 1212, furnishing unit 340 may further obtain accessory objects based on the display information. The accessory objects may complement the furnishing objects. For example, the furnishing objects may include bed 131 placed in bedroom 130, and the accessory objects may include pictures 132 to be hung on the wall behind bed 131 and beddings used on bed 131. The accessory objects may further include other pieces of furniture that usually pair with the furnishing object but not yet included in the furnishing plan. For example, one or more nightstands may be identified to pair with bed 131. In some embodiments, the accessory objects may be selected consistent with display information of the furnishing objects, such as style and dimensions. For example, the nightstands may be selected to be the same style as bed 131 and the beddings may be selected to fit the size of bed 131 (e.g., king-sized, or queen-sized).

In step 1214, furnishing unit 340 may optimize the placement of the furnishing objects and the accessory objects in the furnishing plan based on furnishing preferences. In some embodiments, the furnishing preferences may be provided by the user via user device 204. The furnishing preference may be against the wall (i.e., minimum gap between the furnishing object and the wall) or against the floor. Accordingly, the furnishing objects and accessory objects may be moved in the furnishing plan according to the furnishing preferences.

Figure 13:
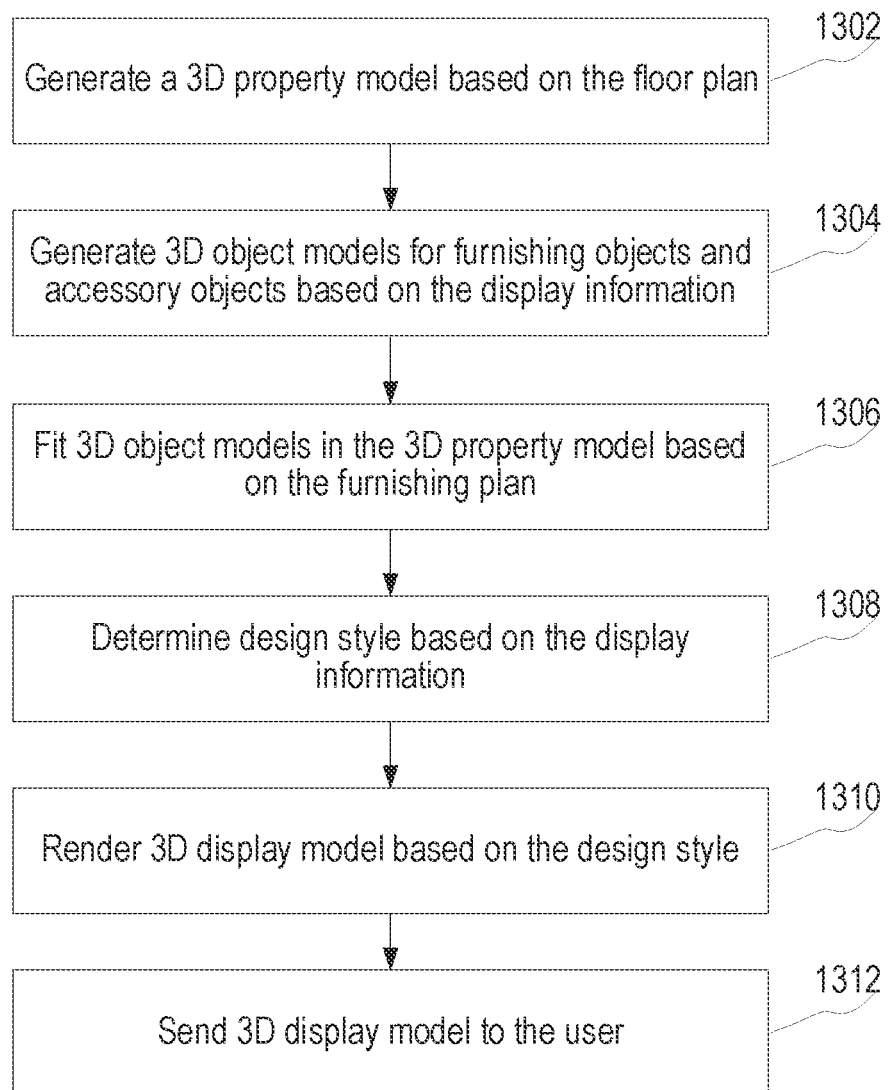
FIG. 13 is a flowchart of an exemplary method for generating a display model visualizing a furnishing plan for a property, according to embodiments of the disclosure.

FIG. 13 is a flowchart of an exemplary method 1300 for generating a display model visualizing a furnishing plan for a property, according to embodiments of the disclosure. In some embodiments, method 1300 may be performed by processor 304 of interior design device 203, e.g., view rendering unit 344. Method 1300 may include steps 1302-1312 as described below. It is to be appreciated that some of the steps may be optional to perform the disclosure provided herein. Further, some of the steps may be performed simultaneously, or in a different order than shown in FIG. 13.

In step 1302, view rendering unit 344 may generate a 3D property model based on the floor plan. In some embodiments, the 3D property model may be generated using CAD modeling tools based on the structural data derived from the floor plan. The 3D property model may display a view of the structures and layout of an unfurnished property.

In step 1304, view rendering unit 344 may generate 3D object models for the furnishing objects and the accessory objects in the furnishing plan based on the display information. Similarly, the 3D object models may also be generated using CAD modeling tools, based on display information such as category, style, and dimensions.

In step 1306, view rendering unit 344 may fit the 3D object models in the 3D property model based on the furnishing plan. The 3D object models are placed at the respective positions in the 3D property model as specified by the furnishing information provided by the furnishing plan.

In step 1308, view rendering unit 344 may determine a design style based on the display information or the furnishing information. In some embodiments, the display information or the furnishing information specifies the style of each furnishing objects and accessary objects. Exemplary styles of a furnishing/accessory object may include European style, oriental style, contemporary style, modern style, etc. The design style of an interior space may be defined collectively by the styles of furnishing objects within that space. For example, if most the furnishing/accessory objects in great room 110 are oriental style, the design style of great room 110 may be determined to be oriental style. In some embodiments, the property may have different design styles in different functional spaces. For example, great room 110 may have an oriental style and bedroom 130 may have a contemporary style.

In step 1310, view rendering unit 344 may render a 3D display model of the property based on the design style(s). For example, the 3D view of property 100 shown in FIG. 1 may be an example of the 3D display model rendered in step 1310. In some embodiments, view rendering unit 344 may adjust the pattern or color of items like window treatments, curtains, tiles, carpets, and hardwood flooring to conform to the respective design styles.

In step 1312, view rendering unit 344 may send the 3D display model to the user. For example, the 3D display model may be sent to user device 204 for display. In some embodiments, the 3D display model may be displayed within a Virtual Reality (VR) tour application, which offers tools for the user to navigate through the 3D display model and review the display information associated with the various furnishing/accessory objects.

Another aspect of the disclosure is directed to a non-transitory computer-readable medium storing instruction which, when executed, cause one or more processors to perform the methods, as discussed above. The computer-readable medium may include volatile or non-volatile, magnetic, semiconductor, tape, optical, removable, non-removable, or other types of computer-readable medium or computer-readable storage devices. For example, the computer-readable medium may be the storage device or the memory module having the computer instructions stored thereon, as disclosed. In some embodiments, the computer-readable medium may be a disc or a flash drive having the computer instructions stored thereon.

Although the embodiments are described using interior design of indoor spaces as examples, it is contemplated that the concepts could be readily expanded and adapted to design of outdoor spaces, such as the deck, the front/back yard, the garage, as well as the neighboring environment. A person of ordinary skill can adapt the disclosed systems and methods without undue experimentation for outdoor designs.

It will be apparent to those skilled in the art that various modifications and variations can be made to the disclosed system and related methods. Other embodiments will be apparent to those skilled in the art from consideration of the specification and practice of the disclosed system and related methods.

It is intended that the specification and examples be considered as exemplary only, with a true scope being indicated by the following claims and their equivalents.

The invention claimed is:

1. A system for generating a remodeling plan for a property, comprising:
a communication interface configured to receive a floor plan of the property and a remodeling preference; and
at least one processor configured to:
obtain structural data of the property based on the floor plan;
obtain a neural network model based on the remodeling preference, wherein the neural network model is trained using sample floor plans and sample remodeling data for the remodeling preference;
learn structural remodeling information based on the floor plan and the structural data using the neural network model; and
generate the remodeling plan for the property by processing the structural remodeling information based on one or more predetermined remodeling decision rules, wherein the remodeling plan identifies one or more structures in the floor plan for remodeling and comprises descriptive information describing structural changes to be made to the one or more structures identified to be remodeled, wherein the predetermined remodeling decision rules are used as constraints for optimizing the structural remodeling information.

2. The system of claim 1, wherein the neural network model is trained by a model training device, configured to:
receive the sample floor plans and the sample remodeling data;
obtain sample structural data based on the sample floor plans;

annotate the sample structural data to add floor plan feature information or grading information;
determine first simplified floor plans for each of the sample floor plans based on the annotated sample structural data; and
train the neural network model using the sample floor plans, the first simplified floor plans, the sample structural data, and the sample remodeling data.

3. The system of claim 2, wherein the grading information is generated by grading the sample structural data according to quality.

4. The system of claim 1, wherein the remodeling preference is to increase a storage space in the property, and wherein the neural network model is trained using a loss function associated with a collective area of storage space in each sample floor plan.

5. The system of claim 1, wherein the structural data includes distribution data of weight-bearing walls, wherein the at least one processor is further configured to:
determine a second simplified floor plan based on the distribution data of the weight-bearing walls, wherein the second simplified floor plan includes a layout of the weight-bearing walls, and
learn the structural remodeling information based on the floor plan, the second simplified floor plan, and the structural data using the neural network model.

6. The system of claim 1, wherein the structural remodeling information further comprises a structural heat map, reflecting structures in the floor plan and probabilities the structures are to be remodeled.

7. The system of claim 6, wherein to process the structural remodeling information subject to one or more predetermined remodeling decision rules, the at least one processor is further configured to:
construct a Monte-Carlo search tree having a plurality of tree nodes each corresponding to a structure in the structural heat map;
traverse the structural heat map subject to the one or more predetermined remodeling decision rules; and
identify the one or more structures to be remodeled.

8. The system of claim 6, wherein the one or more structures identified to be remodeled maximizes an overall remodeling probability of the remodeling plan, wherein the overall remodeling probability is a weighted sum of the probabilities of the one or more structures identified to be remodeled according to the structural heat map.

9. The system of claim 1, wherein the at least one processor is further configured to:
generate descriptive information based on a difference between the floor plan and the remodeling plan.

10. The system of claim 9, wherein the descriptive information describes structural changes to be made to the one or more structures identified by the remodeling plan.

11. The system of claim 1, wherein the one or more predetermined remodeling decision rules comprise one or more construction regulations.

12. A computer-implemented method for generating a remodeling plan of a property, comprising:
receiving a floor plan of the property and a remodeling preference;
obtaining structural data of the property based on the floor plan;
obtaining a neural network model based on the remodeling preference, wherein the neural network model is trained using sample floor plans and sample remodeling data for the remodeling preference;
learning, by at least one processor, structural remodeling information based on the floor plan and the structural data using the neural network model; and
generating, by the at least one processor, the remodeling plan for the property by processing the structural remodeling information based on one or more predetermined remodeling decision rules, wherein the remodeling plan identifies one or more structures in the floor plan for remodeling and comprises descriptive information describing structural changes to be made to the one or more structures identified to be remodeled, wherein the predetermined remodeling decision rules are used as constraints for optimizing the structural remodeling information.

13. The computer-implemented method of claim 12, wherein the neural network model is trained by:
receiving the sample floor plans and the sample remodeling data;
obtaining sample structural data based on the sample floor plans;
annotating the sample structural data to add floor plan feature information or grading information;
determining first simplified floor plans for each of the sample floor plans based on the annotated sample structural data; and
training the neural network model using the sample floor plans, the first simplified floor plans, the sample structural data, and the sample remodeling data.

14. The computer-implemented method of claim 12, wherein the neural network model is trained using a loss function that reflects the remodeling preference.

15. The computer-implemented method of claim 12, wherein the structural data includes distribution data of weight-bearing walls, wherein the computer-implemented method further comprises:
determining a second simplified floor plan based on the distribution data of the weight-bearing walls, wherein the second simplified floor plan includes a layout of the weight-bearing walls; and
learning the structural remodeling information based on the floor plan, the second simplified floor plan, and the structural data using the neural network model.

16. The computer-implemented method of claim 12, wherein the structural remodeling information further comprises a structural heat map, reflecting structures in the floor plan and probabilities the structures are to be remodeled.

17. The computer-implemented method of claim 16, wherein generating the remodeling plan further comprises:
constructing a Monte-Carlo search tree having a plurality of tree nodes each corresponding to a structure in the structural heat map;
traversing the structural heat map subject to one or more remodeling decision rules; and
identifying the one or more structures to be remodeled.

18. The computer-implemented method of claim 12, further comprising:
generating descriptive information based on a difference between the floor plan and the remodeling plan, wherein the descriptive information describes structural changes to be made to the one or more structures identified by the remodeling plan.

19. A non-transitory computer-readable medium having stored thereon computer instructions, when executed by at least one processor, perform a method for generating a remodeling plan of a property, comprising:
receiving a floor plan of the property and a remodeling preference;

obtaining structural data of the property based on the floor plan;

obtaining a neural network model based on the remodeling preference, wherein the neural network model is trained using sample floor plans and sample remodeling data for the remodeling preference;

learning structural remodeling information based on the floor plan and the structural data using the neural network model; and generating the remodeling plan for the property by processing the structural remodeling information based on one or more predetermined remodeling decision rules, wherein the remodeling plan identifies one or more structures in the floor plan for remodeling and comprises descriptive information describing structural changes to be made to the one or more structures identified to be remodeled, wherein the predetermined remodeling decision rules are used as constraints for optimizing the structural remodeling information.

20. The non-transitory computer-readable medium of claim 19, wherein the method further comprises:

generating descriptive information based on a difference between the floor plan and the remodeling plan, wherein the descriptive information describes structural changes to be made to the one or more structures identified by the remodeling plan.

\* \* \* \* \*